(12) United States Patent
Chen

(10) Patent No.: US 8,759,217 B1
(45) Date of Patent: Jun. 24, 2014

(54) METHOD FOR FORMING INTERLAYER CONNECTORS TO A STACK OF CONDUCTIVE LAYERS

(71) Applicant: Shih-Hung Chen, Hsinchu (TW)

(72) Inventor: Shih-Hung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 13 days.

(21) Appl. No.: 13/735,922

(22) Filed: Jan. 7, 2013

(51) Int. Cl.
*H01L 21/00* (2006.01)

(52) U.S. Cl.
USPC ............................................. 438/689

(58) Field of Classification Search
None
See application file for complete search history.

(56) References Cited

U.S. PATENT DOCUMENTS

| | | |
|---|---|---|
| 7,081,377 B2 | 7/2006 | Cleeves |
| 8,383,512 B2 | 2/2013 | Chen et al. |
| 2012/0184097 A1 | 7/2012 | Chen et al. |

OTHER PUBLICATIONS

U.S. Appl. No. 13/451,411, filed Apr. 19, 2012 43 pp.
U.S. Appl. No. 13/451,428, filed Apr. 19, 2012 35 pp.
U.S. Appl. No. 13/607,555 filed Sep. 7, 2012 28 pp.
U.S. Appl. No. 13/593,328 filed Aug. 23, 2012 54 pp.
Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.
Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.
Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.
Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.
Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

*Primary Examiner* — Scott B Geyer
(74) *Attorney, Agent, or Firm* — James F. Hann; Haynes Beffel & Wolfeld LLP

(57) ABSTRACT

A method forms interlayer connectors extending to conductive layers of a stack of W conductive layers interleaved with dielectric layers. The stack is etched to expose landing areas at W−1 conductive layers using a set of M etch masks. For each etch mask m, m going from 0 to M−1, there is a first etching step, at least one mask trimming step, and a subsequent etching step following each trimming step. The etch mask may cover $N^{m+1}$ of the landing areas and the open etch region may cover $N^m$ of the landing areas. N equals 2 plus the number of trimming steps. The trimming step may be carried out so that the increased size open etch region overlies an additional 1/N of the landing areas. Part of the stack surface may be shielded during the removing step to create dummy areas without contact openings.

20 Claims, 19 Drawing Sheets

METHOD FOR FORMING INTERLAYER CONNECTORS TO A STACK OF CONDUCTIVE LAYERS

CROSS-REFERENCE TO RELATED APPLICATIONS

This application is related to the following U.S. patent applications: U.S. patent application Ser. No. 13/049,303, now U.S. Patent Publication No. US-2012-0184097-A1, published 19 Jul. 2012, entitled REDUCED NUMBER OF MASK FOR IC DEVICE WITH STACKED CONTACT LEVELS; U.S. patent application Ser. No. 13/114,931, now U.S. Patent Publication No. US-2012-0181701-A1, published 19 Jul. 2012, entitled MULTILAYER CONNECTION STRUCTURE AND MAKING METHOD; U.S. patent application Ser. No. 13/451,411, filed 19 Apr. 2012, entitled METHOD FOR CREATING A 3D STACKED MULTICHIP MODULE; and U.S. patent application Ser. No. 13/451,428, filed 19 Apr. 2012, entitled INTEGRATED CIRCUIT CAPACITOR AND METHOD; U.S. patent application Ser. No. 13/607,555, filed 7 Sep. 2012, entitled METHOD FOR FORMING INTERLAYER CONNECTORS IN A THREE-DIMENSIONAL STACKED IC DEVICE; and U.S. patent application Ser. No. 13/593,328, filed 23 Aug. 2012, entitled MULTI-LEVEL VERTICAL PLUG FORMATION WITH STOP LAYERS OF INCREASING THICKNESS, the disclosures of which are incorporated by reference. These six applications and the present application have a common assignee.

BACKGROUND OF THE INVENTION

1. Field of the Invention

The present invention relates generally to high density integrated circuit devices, and more particularly to methods for forming interlayer connectors for multi-level three-dimensional stacked devices.

2. Description of Related Art

In the manufacturing of high density memory devices, the amount of data per unit area on an integrated circuit can be a critical factor. Thus, as the critical dimensions of the memory devices approach lithographic technology limits, techniques for stacking multiple levels or layers of memory cells have been proposed in order to achieve greater storage density and lower costs per bit.

For example, thin film transistor techniques are applied to charge trapping memory in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells," IEEE J. of Solid-State Circuits, Vol. 38, No. 11, November 2003. See, also U.S. Pat. No. 7,081,377 to Cleeves entitled "Three-Dimensional Memory."

Another structure that provides vertical NAND cells in a charge trapping memory technology is described in "Novel 3-D Structure for Ultra-High Density Flash Memory with VRAT and PIPE," by Kim et al., 2008 Symposium on VLSI Technology Digest of Technical Papers;" 17-19 Jun. 2008; pages 122-123.

In three-dimensional (3-D) stacked memory devices, conductive interconnects used to couple the lower layers of memory cells to decoding circuitry and the like pass through the upper layers. The cost to implement the interconnections increases with the number of lithographic steps needed. One approach to reduce the number of lithographic steps is described in Tanaka et al., "Bit Cost Scalable Technology with Punch and Plug Process for Ultra High Density Flash Memory," 2007 Symposium on VLSI Technology Digest of Technical Papers; 12-14 Jun. 2007; pages 14-15.

However, one of the drawbacks with conventional 3-D stacked memory devices is that a separate mask is typically used for each contact level. Therefore, if there are, for example, 20 contact layers, 20 different masks are commonly required, each contact level requiring the creation of a mask for that level and an etching step for that level.

SUMMARY OF THE INVENTION

A first example of a method, for use with an electronic device including a stack comprising a plurality of conductive layers interleaved with a plurality of dielectric layers, for forming interlayer connectors extending to respective ones of the plurality of conductive layers is carried out as follows. Portions of the conductive layers and the dielectric layers in the stack are removed to form landing areas on the plurality of conductive layers in the stack. The landing areas are without overlying conductive layers in the stack, and W is the number of conductive layers. The removing step comprises the following. The stack of dielectric/conductive layers is etched to expose landing areas at W−1 conductive layers using a set of M etch masks. The etch masks have mask regions and spaced apart open etch regions. M is greater than or equal to 2, and $N^M$ as less than or equal to W. N is an integer greater than or equal to 3. For each etch mask m in the set, where m goes from 0 to M−1, perform the following. (a) Form etch mask m over the contact region, the etch mask having open etch regions over some of the landing areas. (b) Etch through $N^m$ conductive layers at the open etch regions of mask m. (c) Trim etch mask m to increase the size of the open etch regions to overlie additional contact openings. (d) Etch $N^m$ conductive layers at the increased size open etch regions. (g) If N is greater than 3, repeat the (c) trim step and the (d) etch step N−3 times. Whereby the landing areas on the plurality of conductive layers are exposed with different combinations of the etch masks.

The first example of the interlayer connectors forming method may be carried out with one or more the following. A dielectric fill may be applied over the landing areas, and openings may be created down to the landing areas through the dielectric fill, and the openings may be filled with a conductive material thereby forming interlayer connectors. N may be selected as equal to 2 plus the number of trim steps for each etch mask. Each etch mask may have a mask width with an open etch region having an open region width equal to about the mask width divided by N. In the (a) etch mask forming step, the etch mask may cover $N^{m+1}$ of the landing areas and the open etch region may cover $N^m$ of the landing areas. The trimming step may be carried out so that the increased size open etch region overlie about an additional 1/N of the landing areas. The device may include a surface over the stack, and the method may further include shielding a portion of the surface during the removing step to create dummy areas without contact openings.

A second example of a method, for use with an integrated circuit device including a stack comprising a plurality of conductive layers interleaved with a plurality of dielectric layers, for forming interlayer connectors extending to respective ones of the plurality of conductive layers is carried out as follows. Portions of the conductive layers and the dielectric layers in the stack are removed to form landing areas on the plurality of conductive layers in the stack. The landing areas are without overlying conductive layers in the stack. The removing includes using a set of M etch masks with M being greater than or equal to 2, with W being the number of total conductive layers, and with $N^M$ being less than or equal to W. The etch masks have mask regions and spaced apart open etch regions corresponding to selected landing areas. For etch mask m, where m goes from 0 to M−1, $N^m$ conductive layers are etched over up to 1/N of the landing areas, the etch mask m is trimmed, and $N^m$ conductive layers over up to 1/N of the landing areas are etched. The landing areas on the plurality of conductive layers are exposed with different combinations of the etch masks.

The second example of the interlayer connectors forming method may be carried out with one or more the following. A first contact opening may be created down to a landing area at a first conductive layer. When N=3, each etch mask is trimmed once between etching the conductive layers, and when N=4, each etch mask is trimmed twice between etching conductive layers. The spaced apart open etch regions should overlie about 1/N of the contact openings. Trimming can be carried out to create an increased size open etch region overlying about an additional 1/N of the contact openings. Interlayer connectors extending to the landing areas of the conductive layers can be formed, such as by filling over the landing areas with a dielectric fill material, and using a patterned etching process and a conductive material deposition process to form the interlayer connectors extending through the dielectric fill material to the landing areas in the plurality of conductive layers. The device can include a surface over the stack, and a portion of the surface can be shielded, such as using a hard mask layer at the surface, during the portions removing step.

An example of a set of etch masks for use in exposing landing areas on a plurality of conductive layers interleaved with a plurality of dielectric layers include the following. A set of M etch masks. The etch masks having mask regions and spaced apart open etch regions. M is an integer greater than or equal to 2 and N is an integer greater than or equal to 3. For each etch mask m in the set, where m goes from 0 to M−1, the etch mask covers landing areas on $N^{m+1}$ of the conductive layers and the open etch region covers landing areas on $N^m$ of the conductive layers.

Other aspects and advantages of the present invention can be seen on review of the drawings, the detailed description, and the claims which follow.

DETAILED DESCRIPTION

Figure 1:
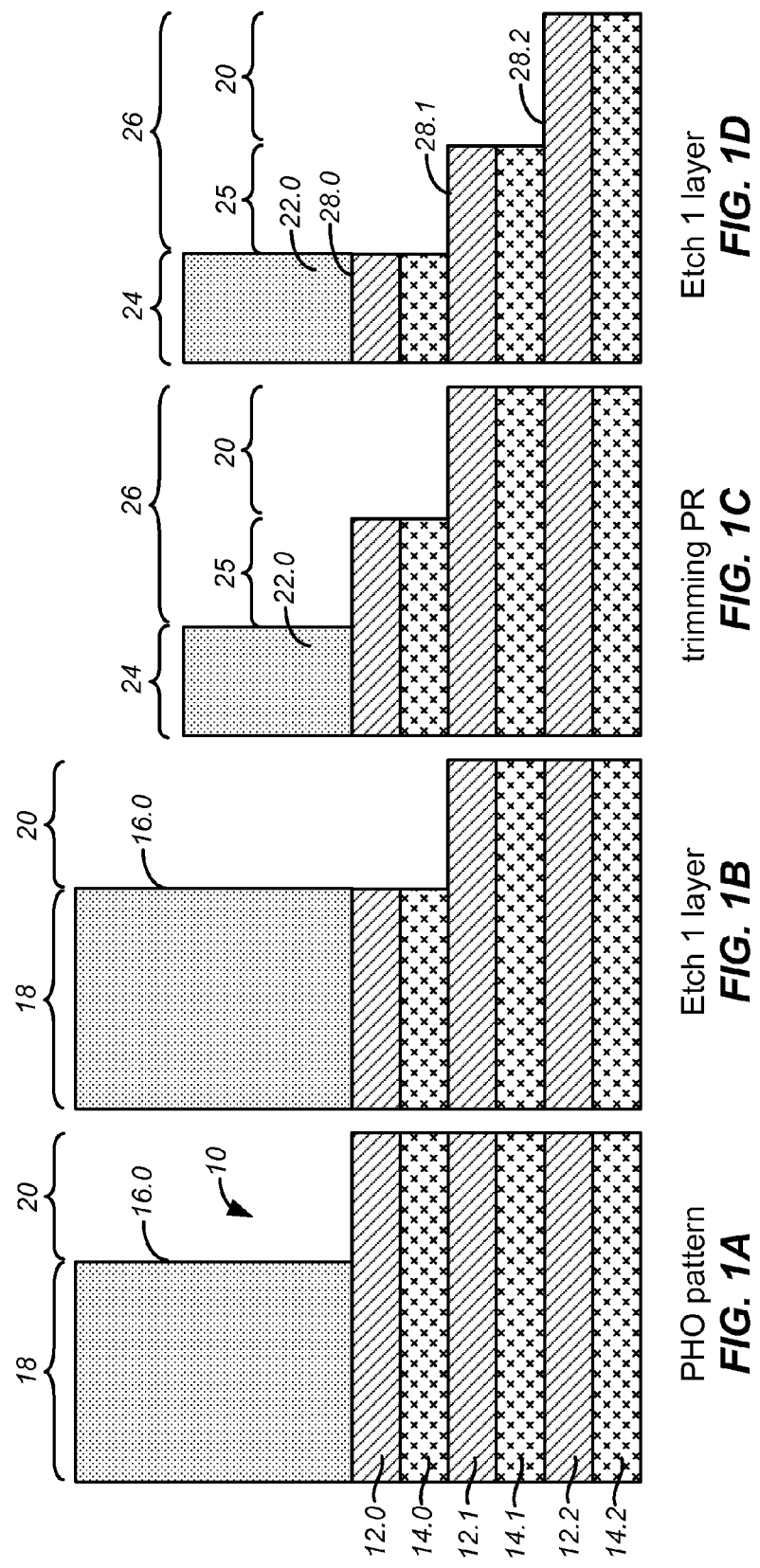
FIGS. 1A-1D are a set of simplified drawing figures illustrating a stack of conductive layers separated by dielectric layers, etching one layer, trimming the etch mask, and etching one layer to create the structure of FIG. 1D.
Figure 2:
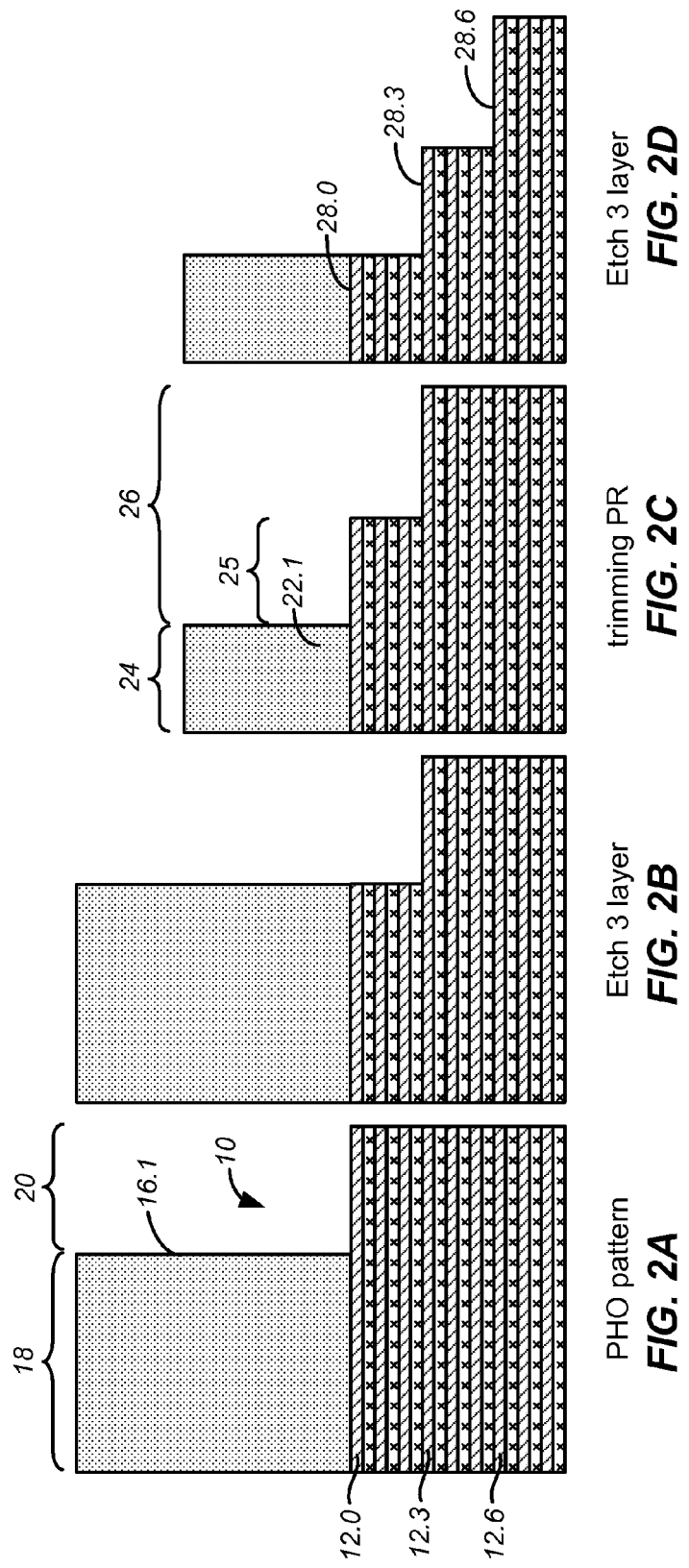
FIGS. 2A-2D are set of simplified drawing figures illustrating a stack of conductive layers separated by dielectric layers, etching three layers, trimming the etch mask, and etching three layers to create the structure of FIG. 2D.
Figure 3:
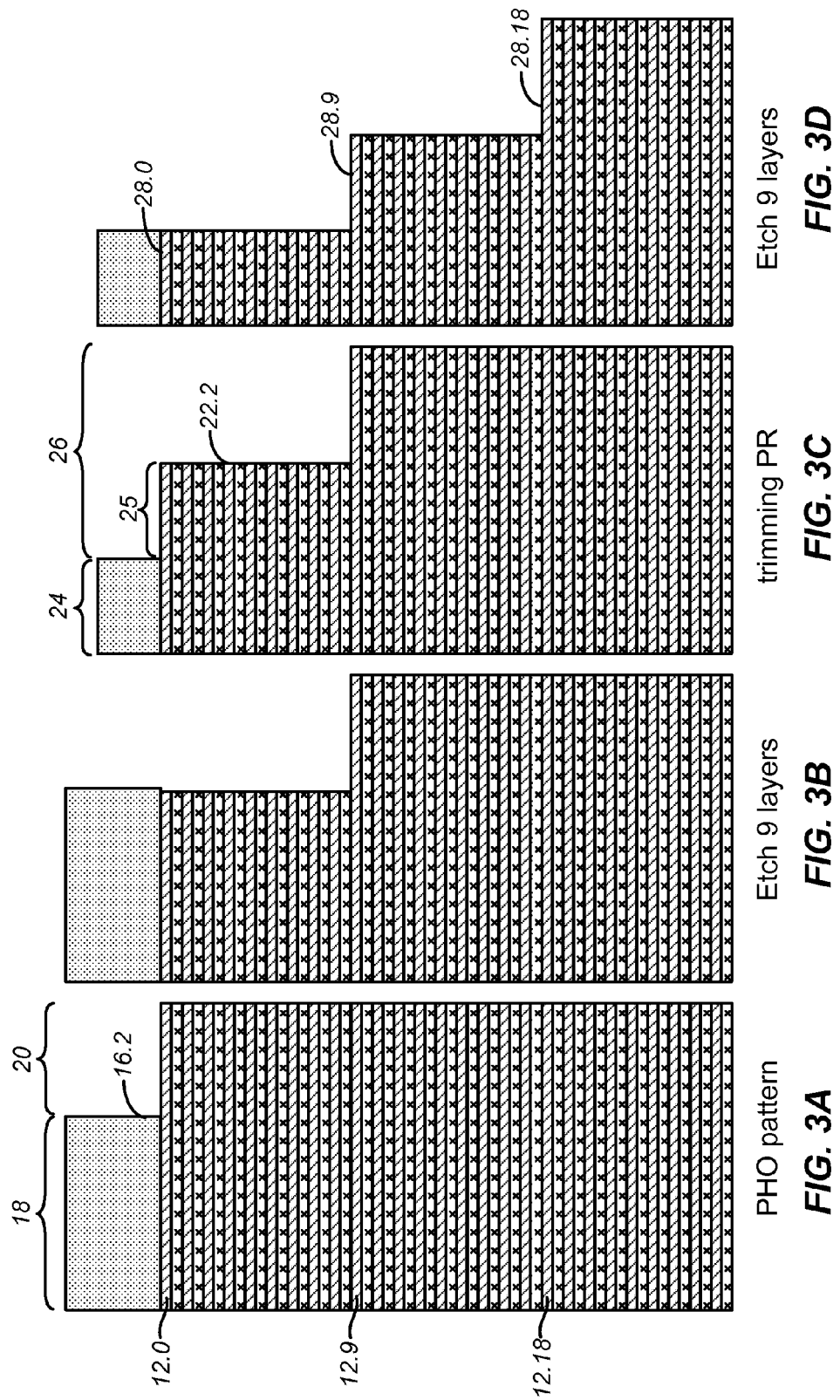
FIGS. 3A-3D are set of simplified drawing figures illustrating a stack of conductive layers separated by dielectric layers, etching nine layers, trimming the etch mask, and etching nine layers to create the structure of FIG. 3D.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

US Patent Publications US-2012-0184097-A1 and US-2012-0181701-A1 disclose what can be referred to as binary systems for forming interlayer connectors extending to the conductive layers of a stack of conductive layers interleaved with dielectric layers. In the binary system, M etch masks can be used in the creation of interlayer connectors to $2^M$ conductive layers. With the present invention, discussed below with reference to various examples, M etch masks can be used to create interlayer connectors to $N^M$ conductive layers, with N being an integer greater than or equal to 3. Therefore, with N equal to 3, only 3 etch masks are needed to form interlayer connectors to landing areas at 27 conductive layers. This is achieved by etching, trimming the etch mask and etching again using the trimmed etch mask. The selection of N reflects the number of times each etch mask is trimmed with N=3 for one trim step, N=4 for two trim steps, etc. Therefore, there is an initial etch step, a trim step, and an etch step following each trim step. With N=3, the process can be referred to as a ternary system. For example, with a quaternary system, so that N=4 reflecting two trim steps, 3 masks (M=3) can be used to create interlayer connectors to landing areas at $4^3$ or 64 conductive layers, while 4 masks (M=4) can be used to create interlayer connectors to landing areas at $4^4$ or 256 conductive layers. Processing limitations may, as a practical matter, limit the number of trim steps for each etch mask.

FIGS. 1A-3D are simplified drawings used to describe several basic steps used in examples of the invention. An integrated circuit includes a stack 10 of conductive layers 12 interleaved with dielectric layers 14. The specific conductive layers and dielectric layers are identified as conductive layer 12.0, 12.1, 12.2, etc. and as dielectric layers 14.0, 14.1, 14.2, etc.

The etching of stack 10 of conductive layers 12 and dielectric layers 14 exposes landing areas 28 using a set of M etch masks. As will be discussed in more detail below, the number of layers etched for each etch mask m in the set, where m goes from 0 to M−1, is equal to $N^m$. FIG. 1A shows a first etch mask 16.0 including a mask region 18 and an open etch region 20. With first etch mask 16.0, m=0 so that $N^m$ equals $3^0$=1, so that one level is etched for each etching step using the first etch mask. FIG. 1B shows result of etching one layer through first conductive layer 12.0 and first dielectric layer 14.0 at the open etch region 20 stopping at second conductive layer 12.1. FIG. 1C shows result of trimming the first etch mask 16.0 of FIG. 1B creating a trimmed first etch mask 22.0 having a trimmed mask region 24, a new open etch region 25, and an expanded open etch region 26, region 26 being equal to regions 20 plus region 25. FIG. 1D shows result of etching one layer of the structure of FIG. 1C at expanded open etch region 26. The resulting structure has exposed conductive landing areas 28, identified as areas 28.0, 28.1 and 28.2. Area 28.0 is considered exposed because it will be upon removal of trimmed etch mask 22.

FIGS. 2A-2D show process steps using a second etch mask 16.1, so that m=1 and $N^m$ equals $3^1$=3 so that three layers are etched for each etching step using the second etch mask. FIG. 2B shows the results of a first etching step etching through 3 layers to expose conductive layer 12.3. FIG. 2C shows result of trimming the second etch mask 30 to create a trimmed second etch mask 22.1 with trimmed mask region 24, new open etch region 25 and open etch region 20. FIG. 2D shows result of etching the structure of FIG. 2C three layers to create landing areas 28.0, 28.3 and 28.6.

FIGS. 3A-3D illustrate process steps using a third etch mask 16.2, so that m=2 and $N^m$ equals $3^2$=9 so that nine layers are etched for each etching step using the third etch mask. FIG. 3B shows the results of a first etching step etching through 9 layers to expose conductive layer 12.9. FIG. 3C shows result of trimming the third etch mask 16.2 to create a trimmed third etch mask 22.2 with trimmed mask region 24, new open etch region 25 and open etch region 20. FIG. 3D shows result of etching the structure of FIG. 3C nine layers to create landing areas 28.0, 28.9 and 28.18.

Figure 4:
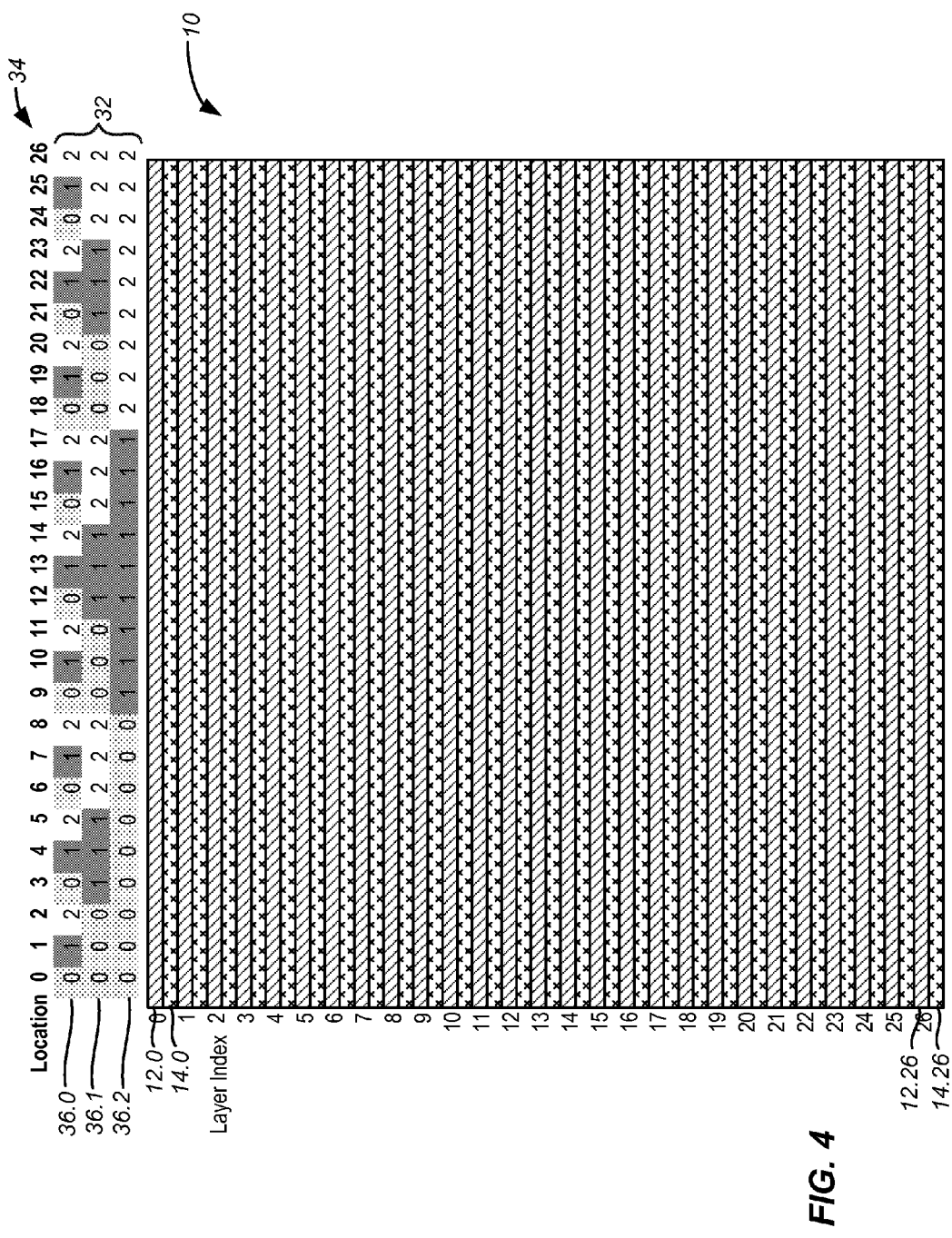
FIG. 4 illustrates a stack of 27 layers, including alternating conductive layers and dielectric layers, with a mask legend overlying the stack, and location numerals 0-26.

FIG. 4 shows a stack 10 of conductive layers 12.0-12.26 and dielectric layers 14.0-14.26. Above stack 10 is an etch mask legend 32 representing three etch masks, first etch mask 36.0, second etch mask 36.1 and third etch mask 36.2; these etch masks correspond to the first, second and third etch masks 16.0-16.2 shown in FIGS. 1A-3D. The etch masks will be used in a ternary system with one trimming step as discussed above with regard to FIGS. 1A-3D. Above the etch mask legend 32 locations 34 are identified by location numerals 0-26 corresponding to the 27 different exposed landing areas 28. In the etch mask legend 32, each etch mask 36.0-36.2 is represented by three numerals. Numeral 0 represents regions where the etch mask is not removed so that these areas are not etched; region 0 corresponds to trimmed mask region 24 as in FIG. 1C. Region 1 represents regions which were initially covered by the photoresist etch mask but then were trimmed away as in FIG. 1C so that these areas are etched once; region 1 corresponds to etch region 25 in FIG. 1C. Region 2 identifies regions which were initially free of overlying photoresist, so that region 2 corresponds to open etch region 20 of FIG. 1A, so that these areas will be etched twice. In this example with a ternary system, with N=3, each of regions 0, 1 and 2 can be about one third of the entire width of the combined region 0-2. With a quaternary system, not disclosed, with N=4, there would preferably be four regions, each can be about one fourth of the entire width of the combined regions 0-3.

It should be noted that the width of stack 10 of each of FIGS. 3A-3D is about one third the width of the corresponding stack 10 of FIG. 4. This is done to help visualize the process steps of FIGS. 3A-3D. The trimmed mask region 24 of FIG. 3D corresponds to the nine locations identified with numeral 0. Similarly, the widths of stacks 10 of FIGS. 1A-1D are substantially larger than the corresponding stack 10 of FIG. 4. For example, trimmed mask region 24 of FIG. 1D is substantially larger than the corresponding region in FIG. 4. This was done to help visualize the single level etching steps of FIGS. 1A-1D. The first etch mask 16.0 is repeated 9 times to create etch mask 36.0 and the second etch mask 16.1 is repeated 3 times to create etch mask 36.1.

Each mask region 24, 25, 20 of the first etch mask 16.0 covers one of regions 0, 1, 2. Generally, each mask region 24, 25, 20 covers $N^m$ locations 34. Therefore, with N=3, reflecting a single trimming step, and m=0, m being an integer equal to the mask number starting with m=0 and continuing to m=2, in this example $N^m=3^0$, that is one location. Therefore, in FIGS. 1A-1D each of mask region 24, 25, 20 of first etch mask 16.0 would cover one location 34. As can be seen in FIG. 4, each mask region 24, 25, 20 of second etch mask 16.1 covers $N^m=3^1$, that is three locations 34. Likewise, with the third etch mask 16.2 of FIG. 3A-3D, mask regions 24, 25, 20 each covers $N^m=3^2$ locations 34, that is nine locations 34. Note that the process sequences of the three etch masks 36.0-36.2 can be changed but results in the same processed stack. For example, etch mask 36.1 could be processed first, followed by etch mask 36.0, followed by etch mask 36.2.

The processed stack 56 of FIG. 8, discussed below, is also, like the example of FIG. 4, formed using a ternary system but with the following main differences. With the FIG. 4 example the etching regions of etch masks 36 are arranged in a repeating 0, 1, 2, 0, 1, 2 order while in the FIG. 8 example the etching regions of etch masks 52 are arranged in mirrored halves in extending outwardly from a centerline 54 in a repeating 0, 1, 2, 2, 1, 0 order.

Figure 5A:
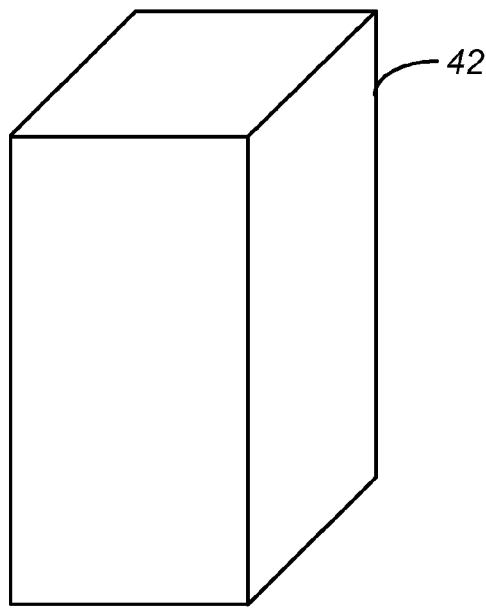
FIGS. 5A and 5B are simplified views illustrating how an isotropic etching process will reduce the size of an etch mask in three dimensions.
Figure 5B:
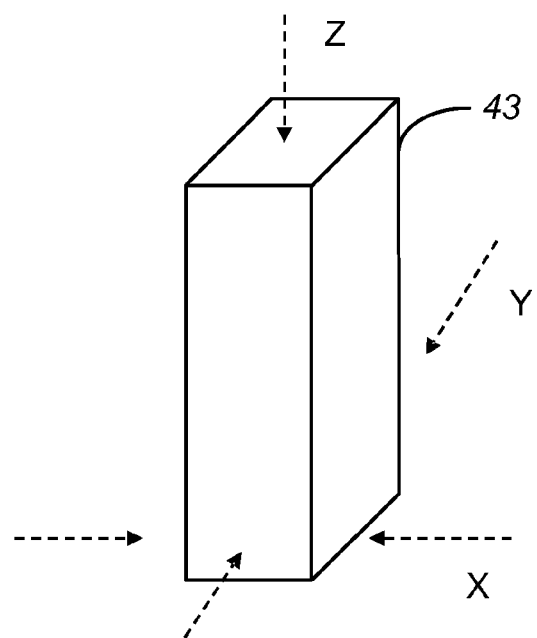
Figure 6A:
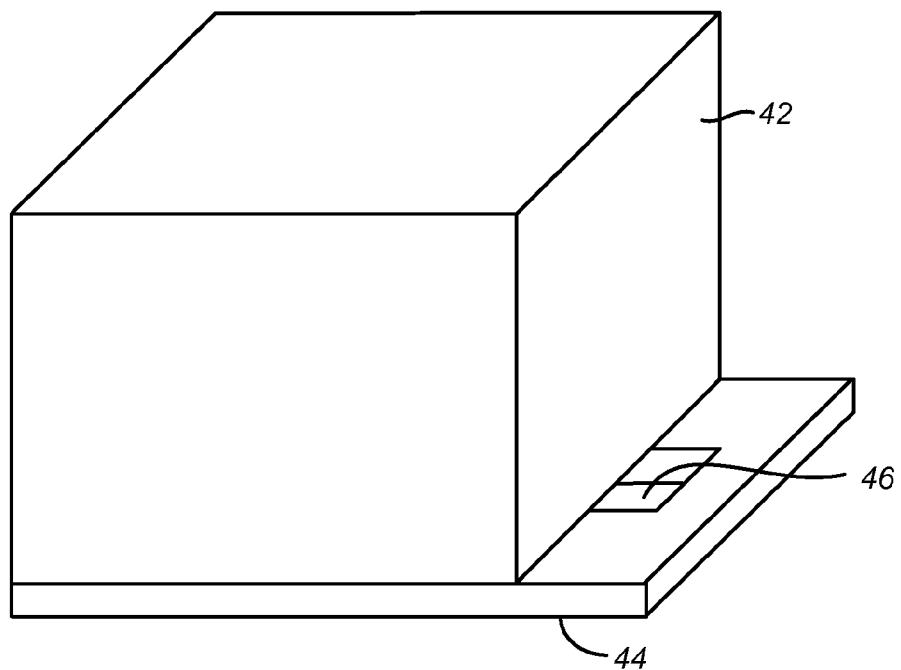
FIGS. 6A and 6B show the use of a bottom hard mask between the stack and the etch mask with FIG. 6A showing the structure before trimming and FIG. 6B shows the structure after trimming.
Figure 6B:
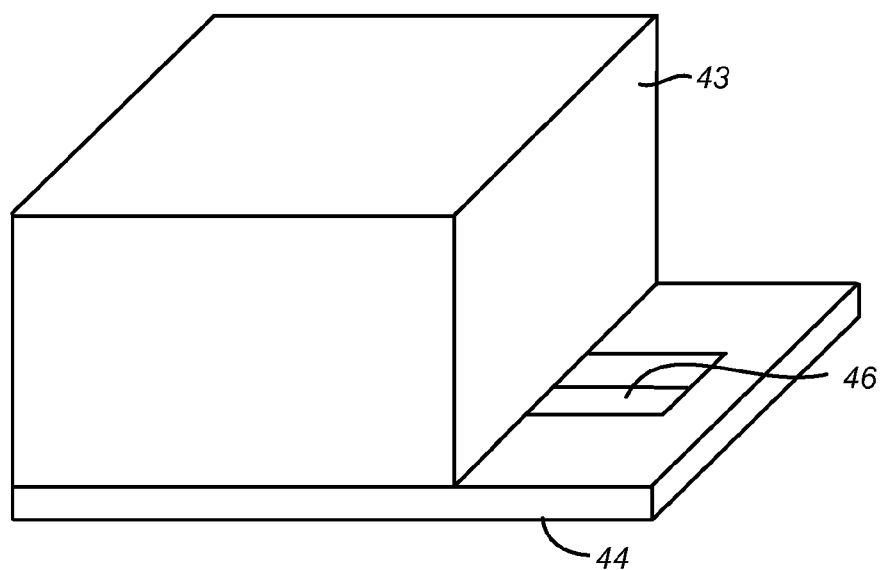

Trimming photoresist mask is normally an isotropic or bidirectional process. In an isotropic process this results in loss of the photoresist mask in the X, Y and Z directions. This is illustrated in FIG. 5A, showing mask 42 before trimming, and the FIG. 5B, showing trimmed mask 43. The loss in the Z direction is usually not a problem because it merely means that the photoresist mask must be thick enough to survive the processing steps. However, the photoresist mask must be appropriately sized in the X and Y directions so that after trimming, areas of the stack 10 that are not intended to be exposed remain covered by the photoresist mask. One way of addressing this problem is to use a bottom hard mask 44 having an opening 46 overlying the area to be etched as shown in FIGS. 6A and 6B. Bottom hard mask 44 is configured so that only the desired regions are exposed by the trimming step or steps for the subsequent etching.

Figure 7A:
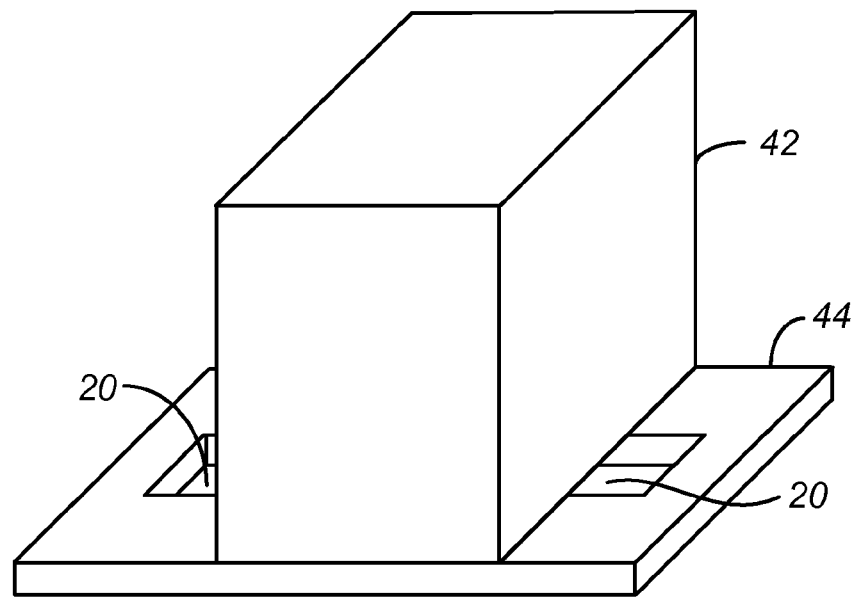
FIGS. 7A and 7B show the use of symmetrical trimming of the etch mask along the X axis.
Figure 7B:
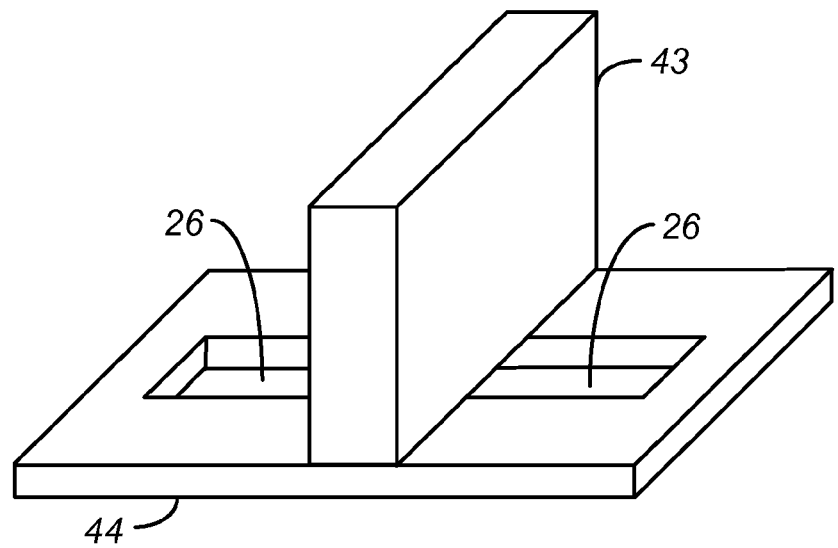

FIGS. 7A and 7B show schematically how the use of trimming symmetry, that is the photoresist mask 42 is symmetrically trimmed along the X axis, exposes open etch regions 20 on both sides of the photoresist mask to create expanded open etch regions 26. This is illustrated in FIGS. 7A and 7B by the increased size of expanded open etch regions 26 of FIG. 7B vs. open etch regions 20 of FIG. 7A. This results in expanded open etch regions 26 on each side of trimmed photoresist mask 43. Such symmetrical trimming expands the open etch regions on both sides in a symmetrical fashion to create a mirror image symmetry of open etch regions.

In addition to trimming symmetry discussed above with regard to FIGS. 7A and 7B, there is another aspect to mirror image symmetry which relates to how the etch masks are arranged over the stack. FIG. 8 shows a processed stack 56 created using the etch masks 52.0, 52.1, 52.2, which are mirror images on each side of centerline 54. However, in addition to being mirror images on each side of centerline 54, the etch masks 16.0, which make up etch mask 52.0, alternate between a region 0, 1, 2 order and a region 2, 1, 0 order. Similarly, the etch mask 16.1, which make up etch masks 52.1, alternate between a region 0, 0, 0, 1, 1, 1, 2, 2, 2 order and a region 2, 2, 2, 1, 1, 1, 0, 0, 0 order. Accordingly, the component etch masks 16.0, 16.1 are arranged as mirror images in etch masks 52.0, 52.1 so that the symmetrical etching along the X axis, as discussed above with regard to FIGS. 7A and 7B, occurs within etch masks 52.0 and 52.1 during the etching and trimming steps. This results in processed stack 56.

The mirror design process discussed above with regard to FIGS. 7A-8 may be useful for high density requirements. This particular design of FIG. 8 creates two landing areas 28 at each conductive layer 12. If two landing areas 28 are not needed, etch mask 52 can be used on only one side of centerline 54. Multiple sets of mirror design etching mask 52, each centered on its own centerline 54, may also be used.

Figure 8:
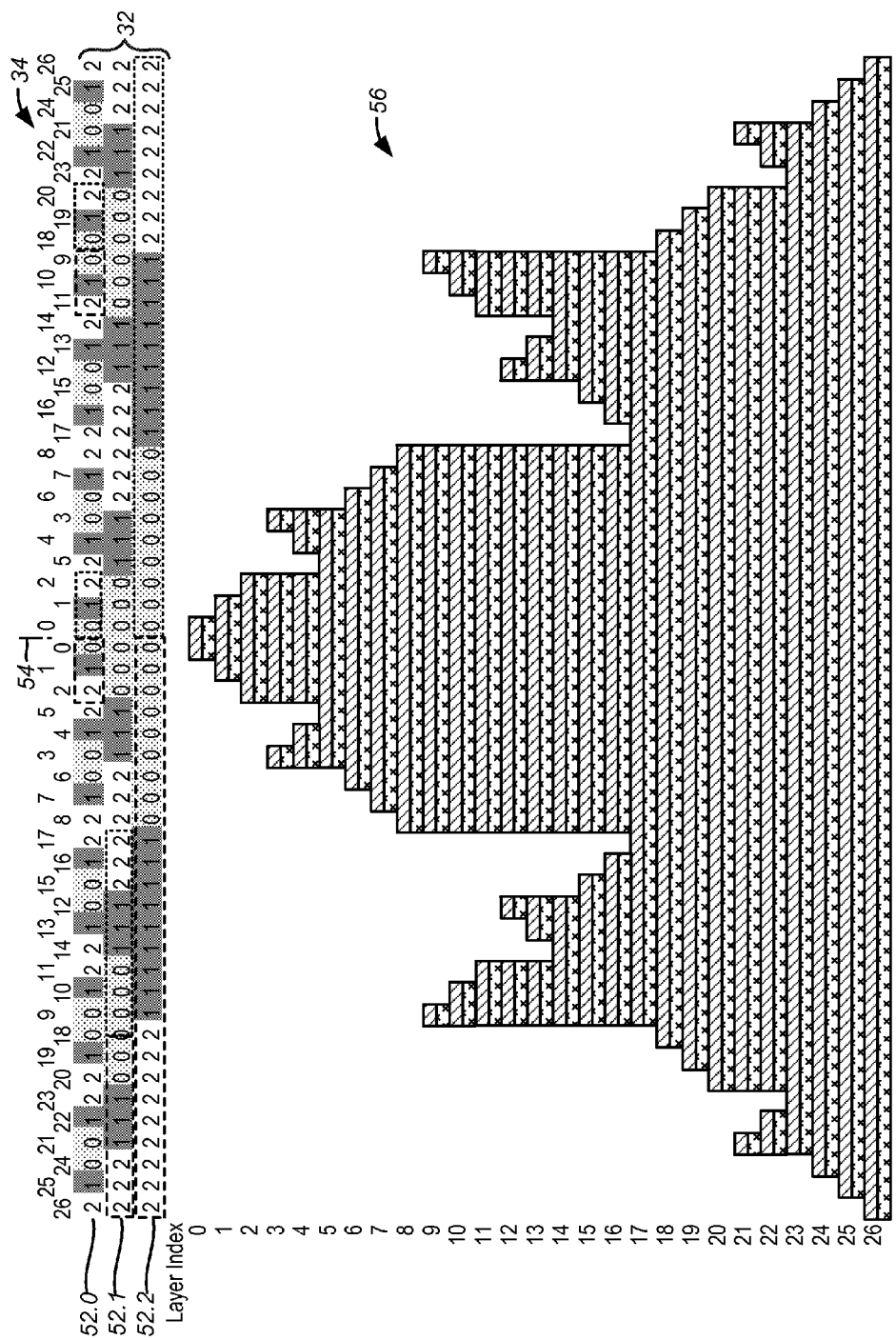
FIG. 8 shows a processed stack created using the overlying mirror design etch masks.
Figure 9:
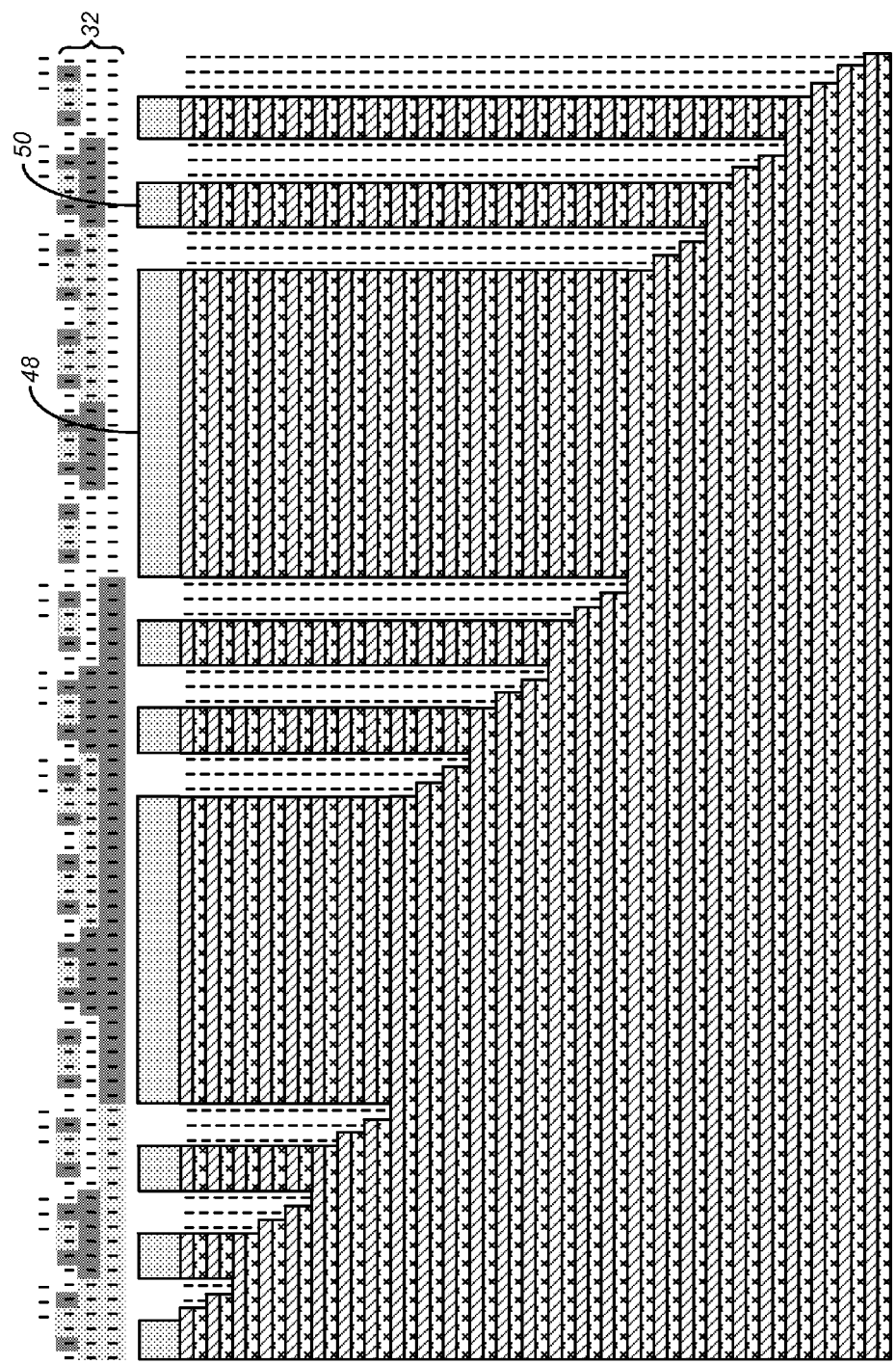
FIG. 9 illustrates a portion of an actual layout showing the use of a hard mask having large and small dummy areas.

FIG. 9 illustrates the right-hand portion of a mirror design similar to that of FIG. 8. However, the FIG. 9 design includes the use of hard mask 44 having large and small hard mask dummy areas 48, 50 to remedy some of the etching problems which can arise using the example of FIG. 4. In the example of FIG. 9, a mirror design of the etch masks corresponding to etch masks 16.0, 16.1 and 16.2 are used. Small dummy areas 50 extend over three locations 34 corresponding to of etch mask 16.0 while large dummy areas 48 extend over 21 locations 34. In some examples only small dummy areas 50 may be used. While in the example of FIG. 9 small dummy areas 50 are shown to be as wide as three landing areas 28, they could be a greater or lesser number, such as one landing area wide. In the example of FIG. 9, etch masks 52.0, 52.1 and 52.2 continue the same back-to-back repeating patterns with regions 0, 1 and 2 in the hard mask dummy areas 48, 50; however, continuing the same back-to-back repeating patterns in the hard mask dummy areas 48, 50 is not necessary because there is no etching taking place at the hard mask dummy areas. The mirror design of FIG. 8, which does not have the unused areas beneath hard mask dummy areas 48, 50, may be preferred when a stairstep arrangement, such as in FIG. 9, is not required.

FIGS. 10-21 illustrate an example of a process for making the processed stack 56 of FIG. 8. Note that FIGS. 10-21 correspond to FIGS. 1A-3D.

Figure 10:
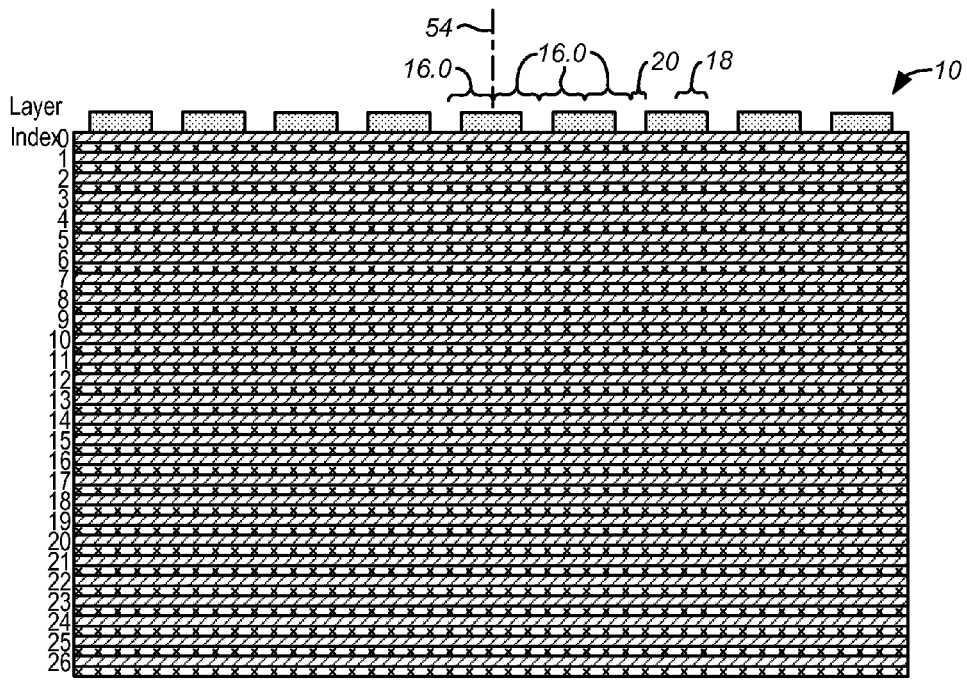
FIGS. 10-21 illustrate an example of a process for making the processed stack of FIG. 8.

In FIG. 10, a series of etch masks 16.0 are formed over conductive layer 12.0 of level 0 starting outwardly from centerline 54. As discussed above with regard to FIG. 8, pairs of mirror images of etch mask 16.0 extend outwardly from centerline 54. The orientation of each successive etch mask 16.0 on either side of centerline 54 alternates so that either open etch regions 20 abut or mask regions 18 abut. FIG. 10 corresponds to FIG. 1A.

Figure 11:
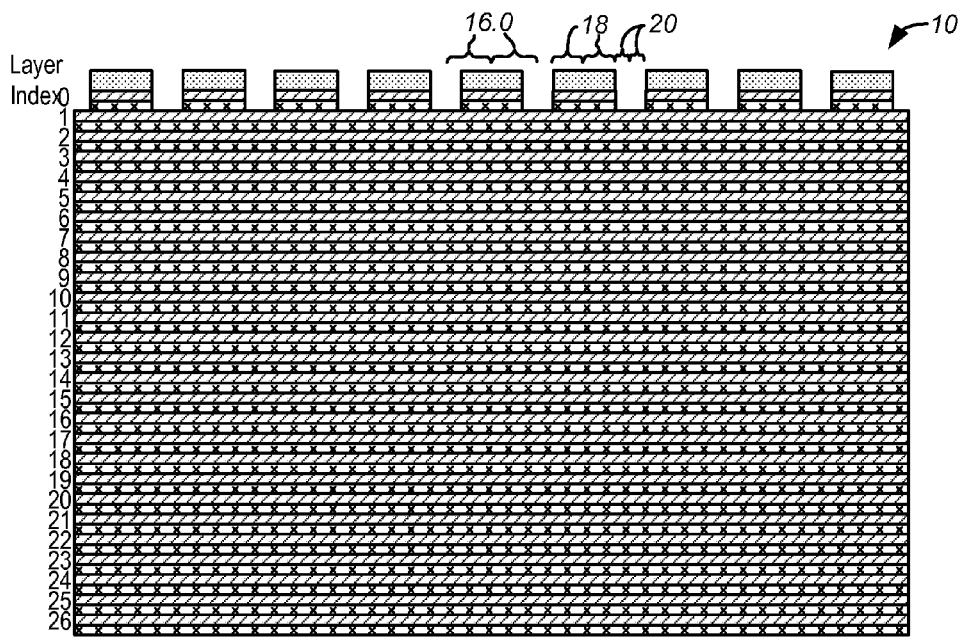
Figure 12:
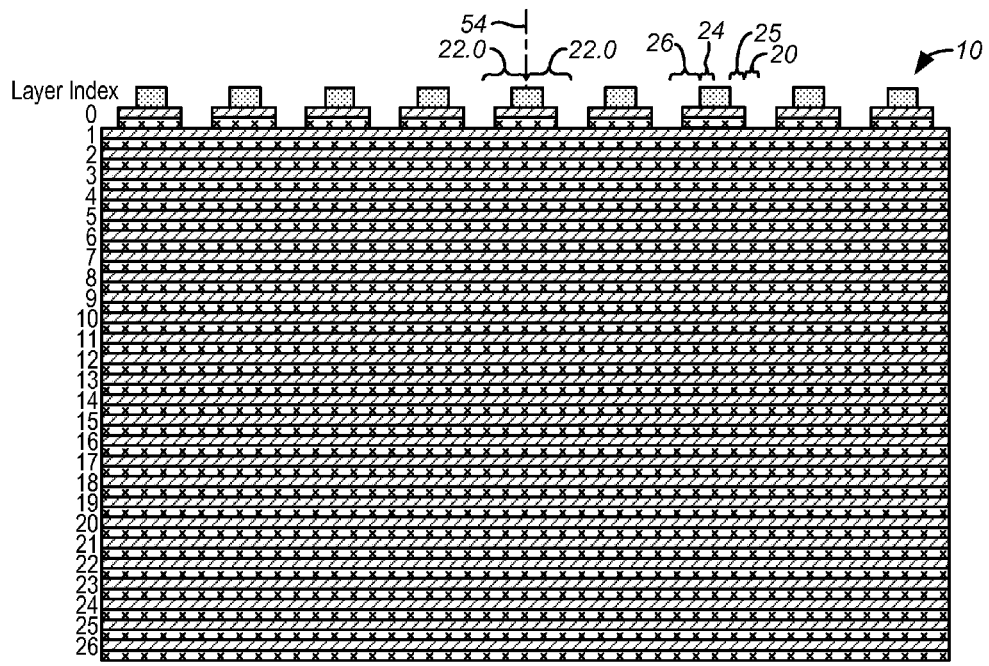
Figure 13:
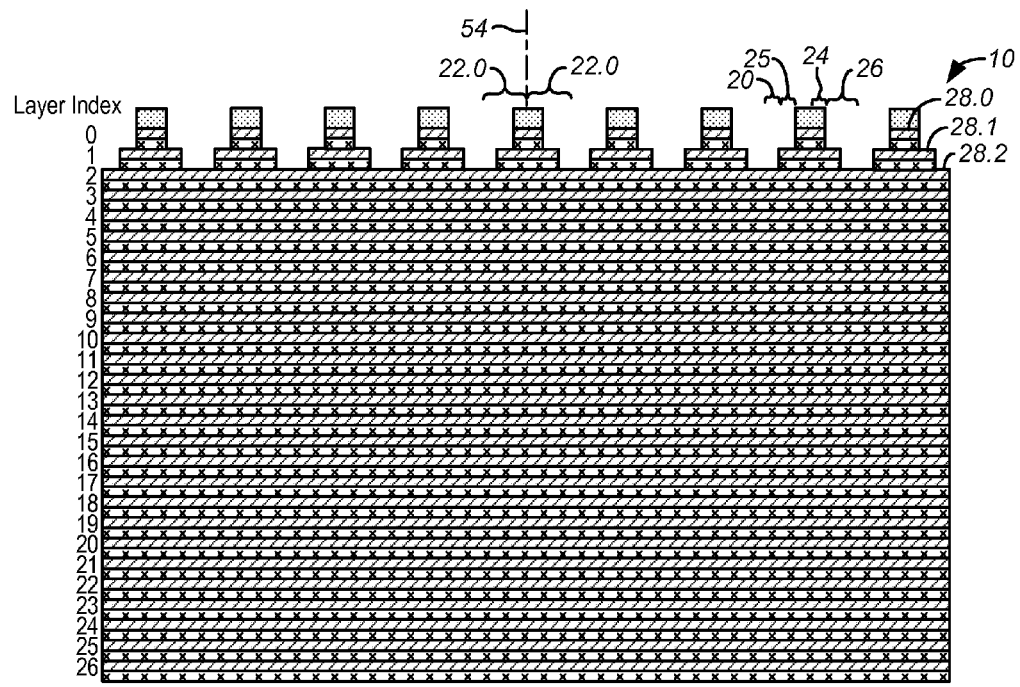

In FIG. 11, which corresponds to FIG. 1B, the structure of FIG. 10 is shown after etching one level at open etch regions 20. FIG. 12, corresponding to FIG. 1C, shows the structure of FIG. 11 after trimming of first etch masks 16.0 to create trimmed first etch masks 22.0, each trimmed first etch mask 22.0 including a trimmed mask region 24, a new open etch region 25, and an open etch region 20, regions 25 and 20 constituting expanded open etch region 26. FIG. 13, corresponding to FIG. 1D, shows the structure of FIG. 12 after etching one layer of stack 10 exposed at expanded open etch regions 26.

Figure 14:
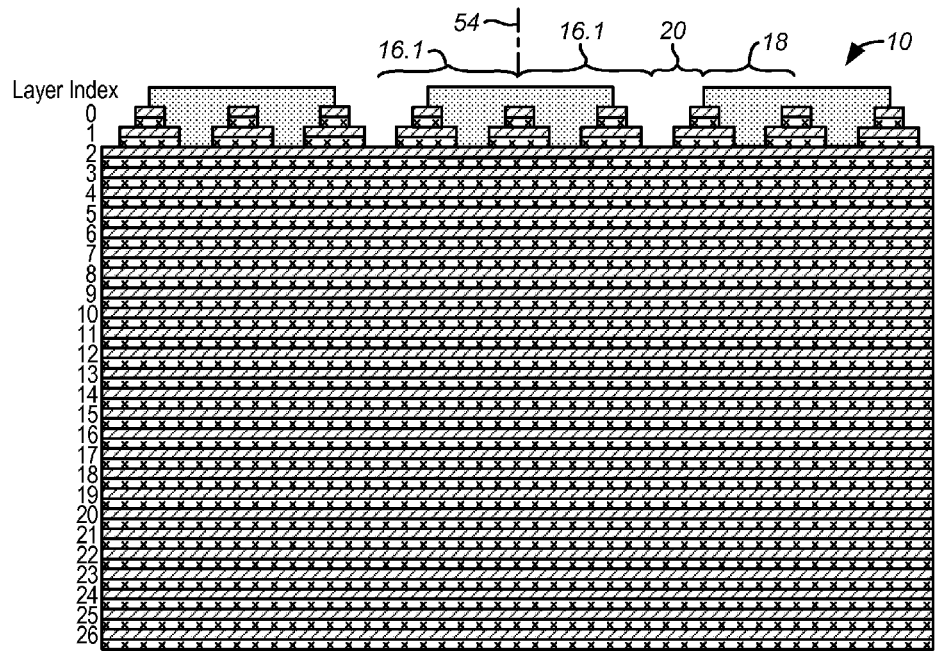
Figure 15:
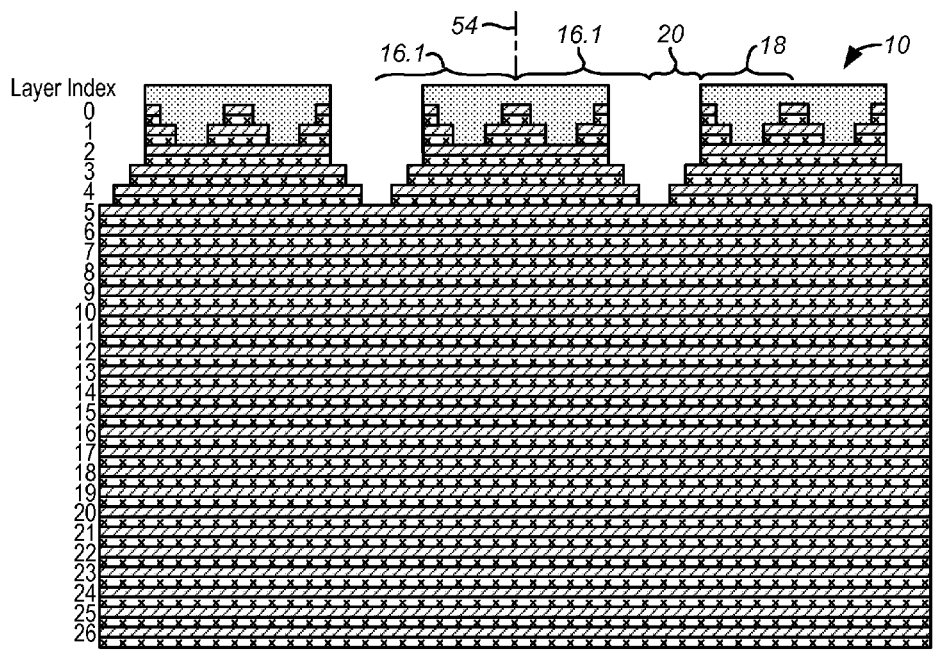
Figure 16:
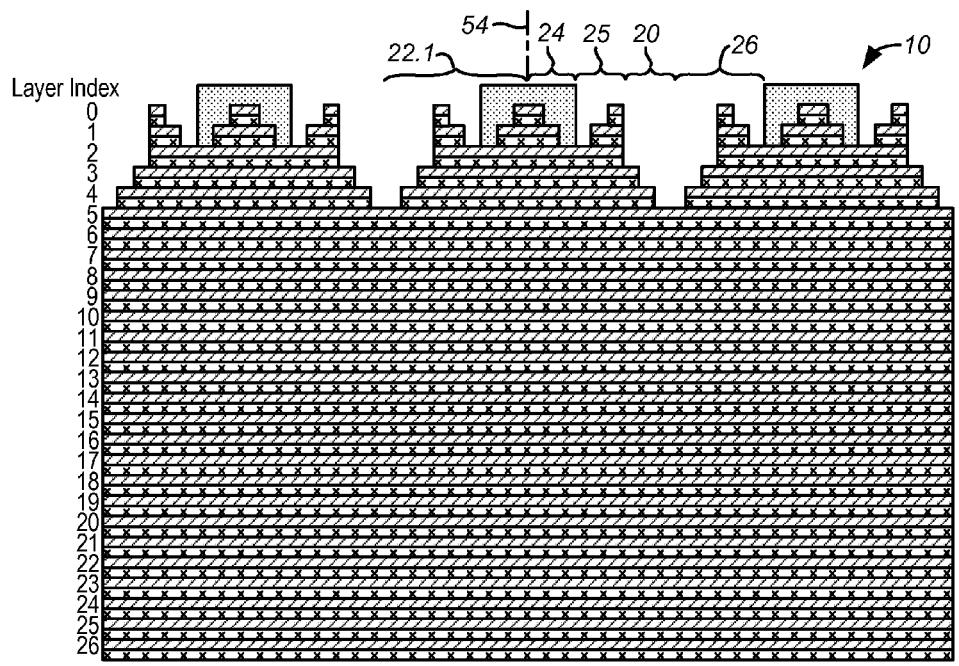
Figure 17:
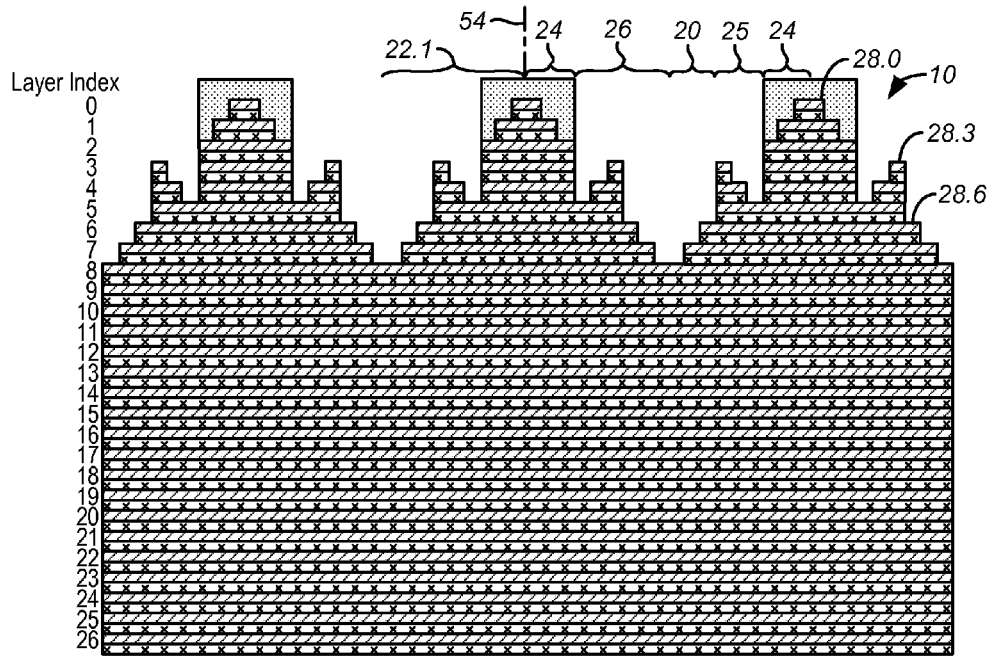

FIG. 14 shows the structure of FIG. 13 using a second etch mask 16.1, each a second etch mask 16.1 including a mask region 18 and an open etch region 20. The arrangement of etch mask 16.1 is the same as for etch mask 16 of FIG. 10 with the mirror image arrangement on each side of centerline 54 with the mask regions 18 abutting and the open etch regions 20 abutting. In FIG. 15, which corresponds to FIG. 2B, the structure of FIG. 14 is shown after etching through three layers at open etch regions 20. FIG. 16, corresponding to FIG. 2C, shows the structure of FIG. 15 after trimming of second etch masks 16.1 to create trimmed second etch masks 22.1, each trimmed second etch mask 22.1 including a trimmed mask region 24, a new open etch region 25, and an open etch region 20, regions 25 and 20 constituting expanded open etch region 26. FIG. 17, corresponding to FIG. 2D, shows the structure of FIG. 16 after etching three layers of stack 10 exposed at expanded open etch regions 26.

Figure 18:
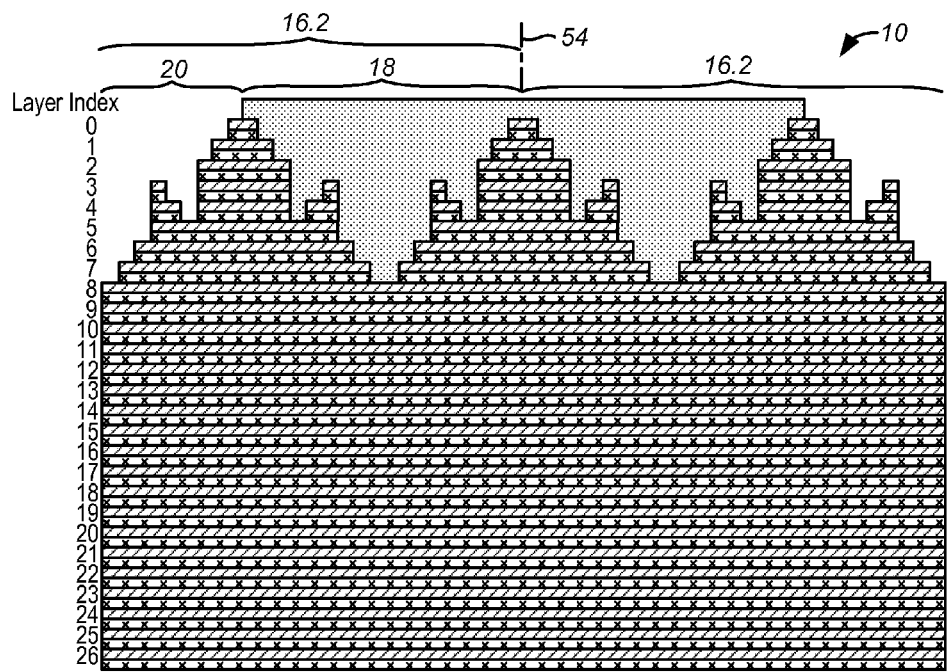
Figure 19:
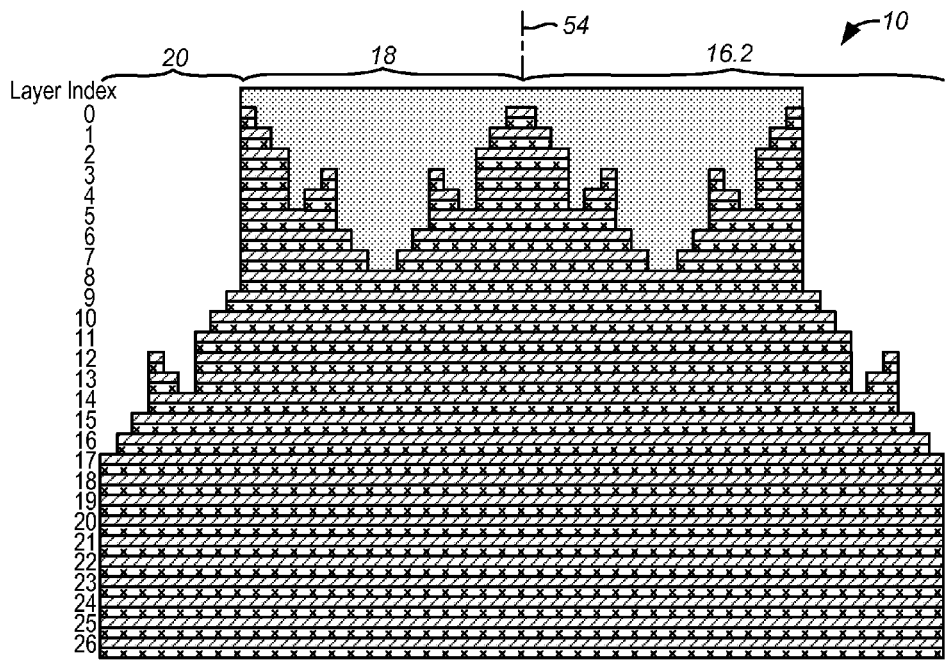
Figure 20:
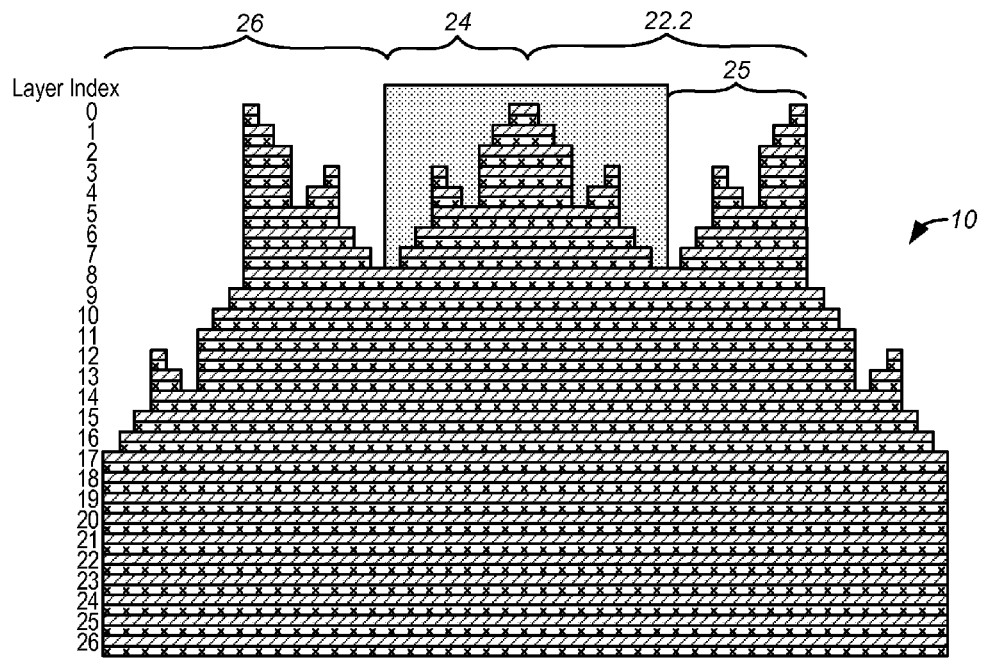
Figure 21:
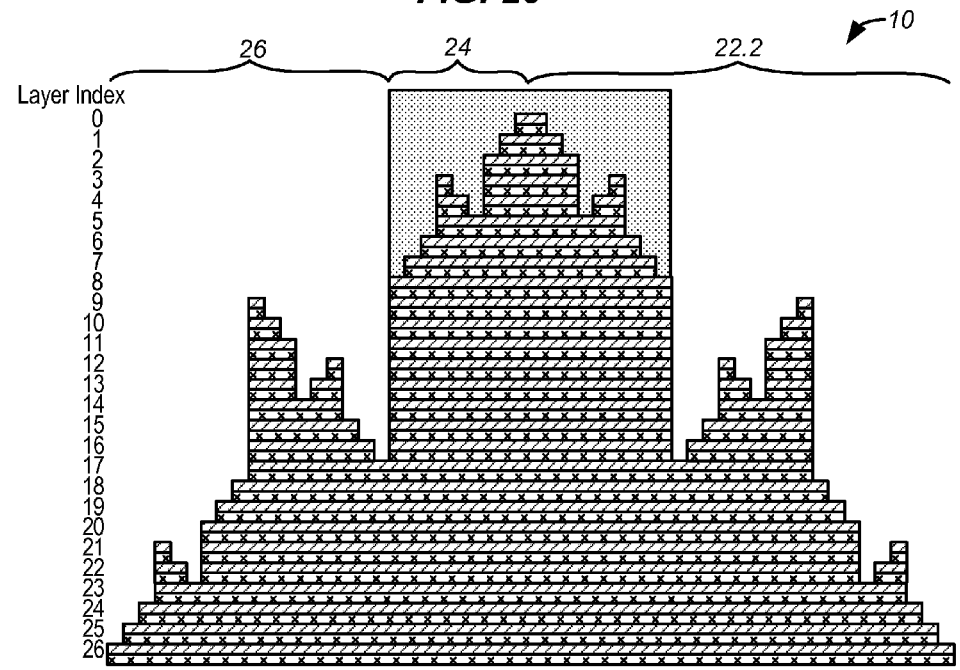

FIG. 18 shows the structure of FIG. 17 using a third etch mask 16.2, one on each side of centerline 54. Each third etch mask 16.2 includes a mask region 18 and an open etch region 20. The arrangement of the two third etch masks 16.2 is the same as for etch mask 16 of FIG. 10 with the mirror image arrangement on each side of centerline 54 with the mask regions 18 abutting. In FIG. 19, which corresponds to FIG. 3B, the structure of FIG. 18 is shown after etching through nine layers at open etch regions 20. FIG. 20, corresponding to FIG. 3C, shows the structure of FIG. 19 after trimming of third etch masks 16.2 to create trimmed third etch masks 22.2, each trimmed third etch mask 22.2 including a trimmed mask region 24, a new open etch region 25, and an open etch region 20, regions 25 and 20 constituting expanded open etch region 26. FIG. 21, corresponding to FIG. 3D, shows the structure of FIG. 20 after etching nine additional layers of stack 10 exposed at expanded open etch regions 26. Thereafter the remaining trimmed mask region 24 of FIG. 21 is removed resulting in the processed stack 56 of FIG. 8.

Figure 22:
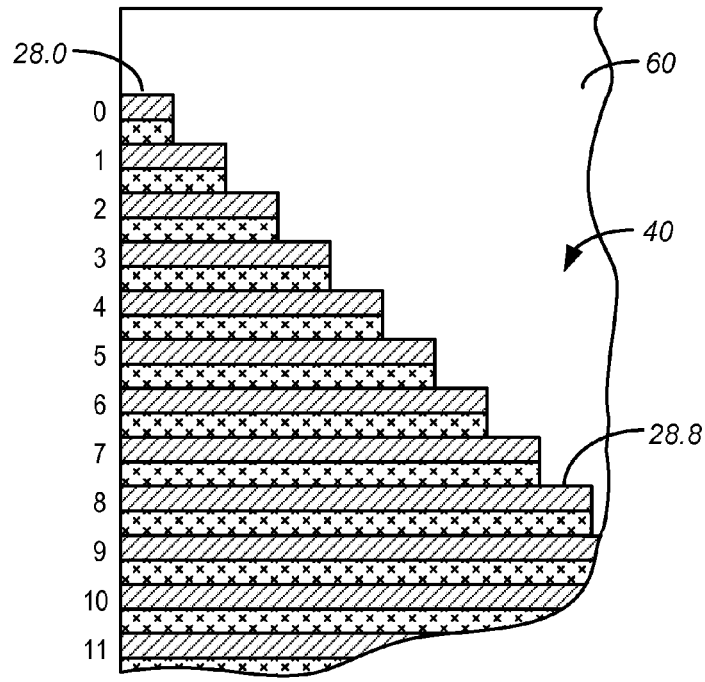
FIG. 22 illustrates dielectric material covering the landing areas of a portion of a processed stack.
Figure 23:
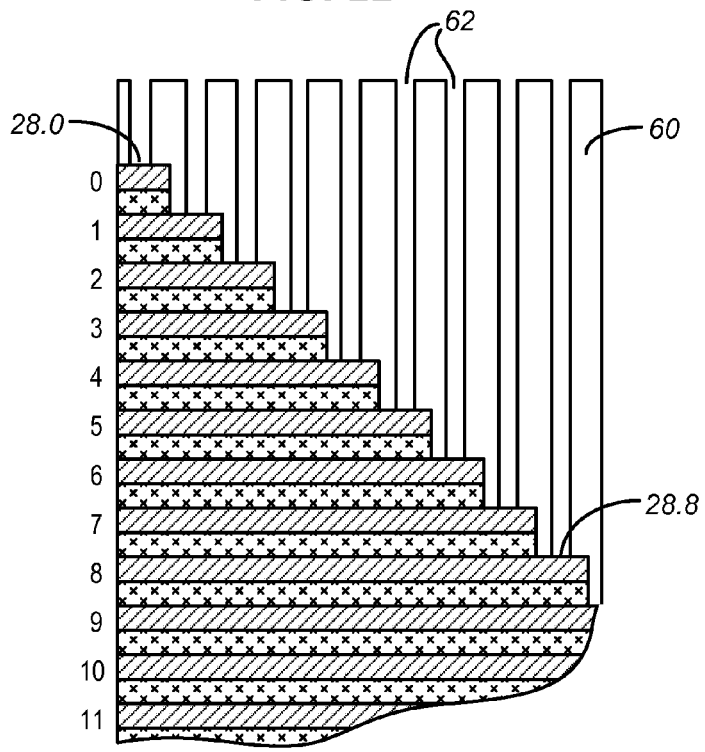
FIG. 23 shows the structure of FIG. 22 with contact openings formed through the dielectric material down to the landing areas.

The landing areas of the stairstep processed stack are then covered by a dielectric material. FIG. 22 illustrates a portion of a processed stack 40 with a dielectric material 60 covering landing areas 28. Dielectric material 60 may be the same material as dielectric layers 14 or a different material. FIG. 23 shows contact openings 62, which can be formed by a patterned etching process, to extend down to landing areas 28. Contact openings 62 are then filled with a conductive material so to contact landing areas 28 to create interlayer connectors 64. A planarizing process, such as chemical mechanical polishing, can be used to create the planarized surface 66 of the three-dimensional stairstep structure 68 including stair stepped landing area 70 shown in FIG. 24.

Further information on similar techniques and methods for creating contact openings 62 are disclosed in U.S. patent application Ser. No. 13/049,303, filed 16 Mar. 2011, entitled REDUCED NUMBER OF MASK FOR IC DEVICE WITH STACKED CONTACT LEVELS; in U.S. patent application Ser. No. 13/114,931, filed 24 May 2011, entitled MULTI-LAYER CONNECTION STRUCTURE AND MAKING METHOD; in U.S. patent application Ser. No. 13/451,411, filed 19 Apr. 2012, entitled METHOD FOR CREATING A 3D STACKED MULTICHIP MODULE; in U.S. patent application Ser. No. 13/451,428, filed 19 Apr. 2012, entitled INTEGRATED CIRCUIT CAPACITOR AND METHOD, the disclosures of which are incorporated by reference. These four applications and the present application have a common assignee.

Conductive layers 12 can be electrically conductive semiconductors including heavily doped polysilicon (using dopants such as As, P, B), silicides including TiSi, CoSi, oxide semiconductors, including InZnO, InGaZnO, and combinations of semiconductors and silicides. Conductive layers 12 can also be a metal, a conductive compound, or combinations of materials including Al, Cu, W, Ti, Co, Ni, TiN, TaN, TaAlN, and others. Interlayer connectors 64 can be a metal or other electrically conductive materials appropriate for use with the materials used for conductive layers 12. Dielectric layers 14 and dielectric material 60 can be an oxide, nitride, oxynitride, silicate, or others. Low dielectric constant materials having a dielectric constant smaller than that of silicon dioxide, such as $SiCHO_x$, may be preferred. High dielectric constant (high-k) materials having a dielectric constant greater than that of silicon dioxide, such as $HfO_x$, HfON, $AlO_x$, $RuO_x$, $TiO_x$, may be included also.

Bottom hard mask 44, acting as an etch stop layer, can be made of, for example, silicon nitride when the dielectric fill is a silicon dioxide compound. Other dielectrics that can be selectively etched can be used as well.

The present invention can be used with a wide range of integrated circuit devices including, for example, 3-D NAND Flash memory, and can be features of integrated circuits including, for example, through silicon via (TSV) structures, sometimes referred to as stacking chips, with conductive layers 12 being separate integrated circuit with landing areas on parts of the conductive layers. Invention can also be used in the creation of stacked plate capacitors on chips, such as shown in application Ser. No. 13/451,428, filed 19 Apr. 2012, with conductive layers 12 and dielectric layers 14 corresponding to the electrode layers and dielectric layers of the capacitors of that application. Conductive layers 12 can be word lines or bit line connectors on different layers of a 3-D array of a 3-D memory structure. Conductive layers 12 can be connectors among layers of conductors on an IC package. Conductive layers 12 can be connectors among ICs in a multichip module type IC package.

Figure 25:
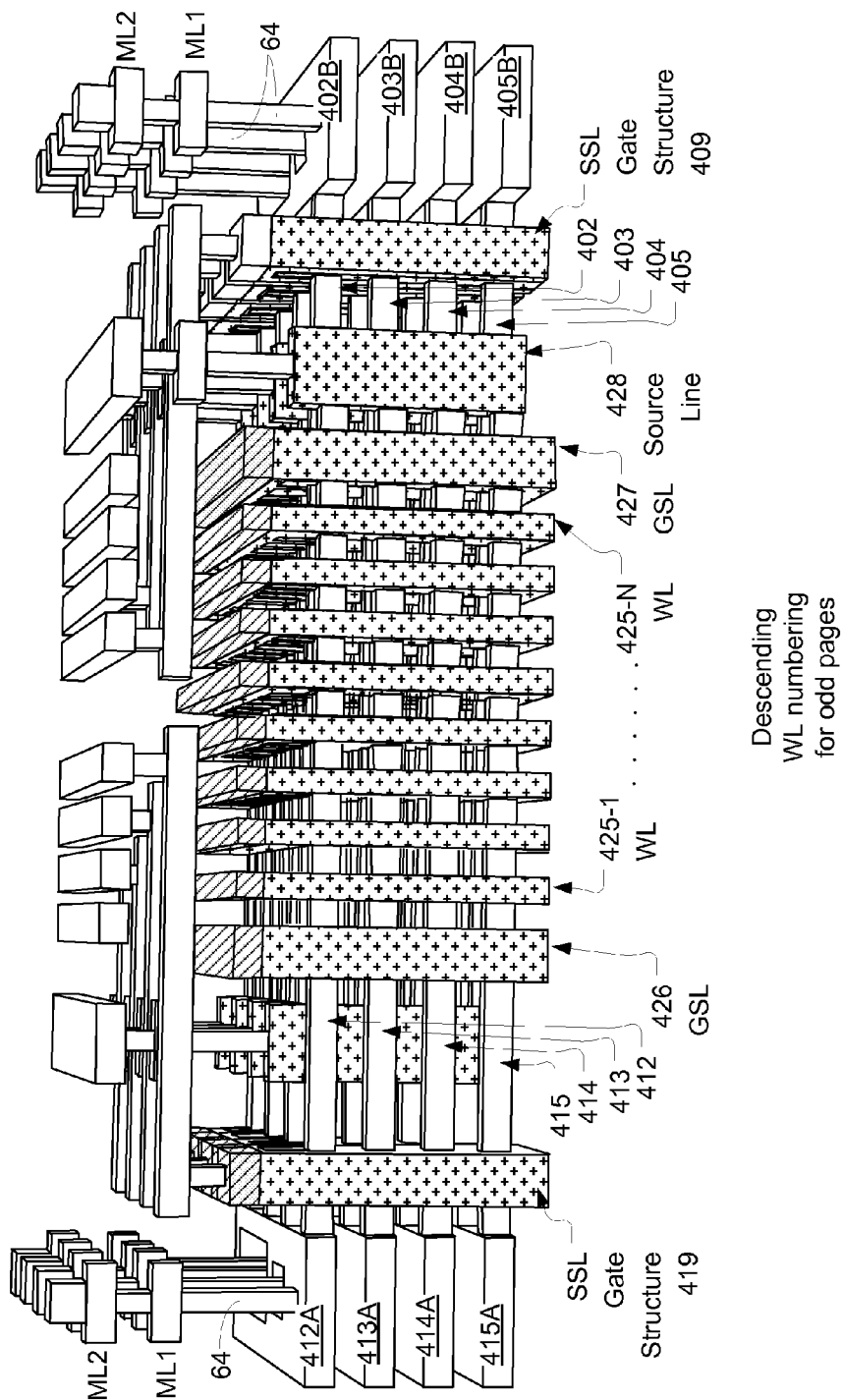
FIG. 25 illustrates an example of a memory array structure in which the metal layers can be connected to semiconductor strips using the concepts and techniques discussed above with regard to FIGS. 1-24.

FIG. 25 is an illustration of a 3D NAND memory array structure which can take advantage of the various examples of the process steps discussed above. The 3-D NAND memory array structure has successively higher metal layers of string select lines with a lengthwise orientation parallel to the semiconductor material strips, string select lines with a widthwise orientation parallel to the word lines, and bit lines with a lengthwise orientation parallel to the semiconductor material strips that can be read utilizing the various read biasing arrangements and timing schemes discussed herein. The multilayer array is formed on an insulating layer, and includes a plurality of word lines 425-1, ..., 425-n–1, 425-n conformal with the plurality of ridge-shaped stacks, and which act as word lines WLn, WLn–1, ... WL1. The plurality of ridge-shaped stacks includes semiconductor strips 412, 413, 414, 415. Semiconductor strips in the same plane are electrically coupled together by three-dimensional stairstep structures, a simplified example being shown in FIG. 25 as 3-D stairstep structure 68 with a stair stepped landing area 70.

The shown word line numbering, ascending from 1 to N going from the back to the front of the overall structure, applies to even memory pages. For odd memory pages, the word line numbering descends from N to 1 going from the back to the front of the overall structure.

Figure 24:
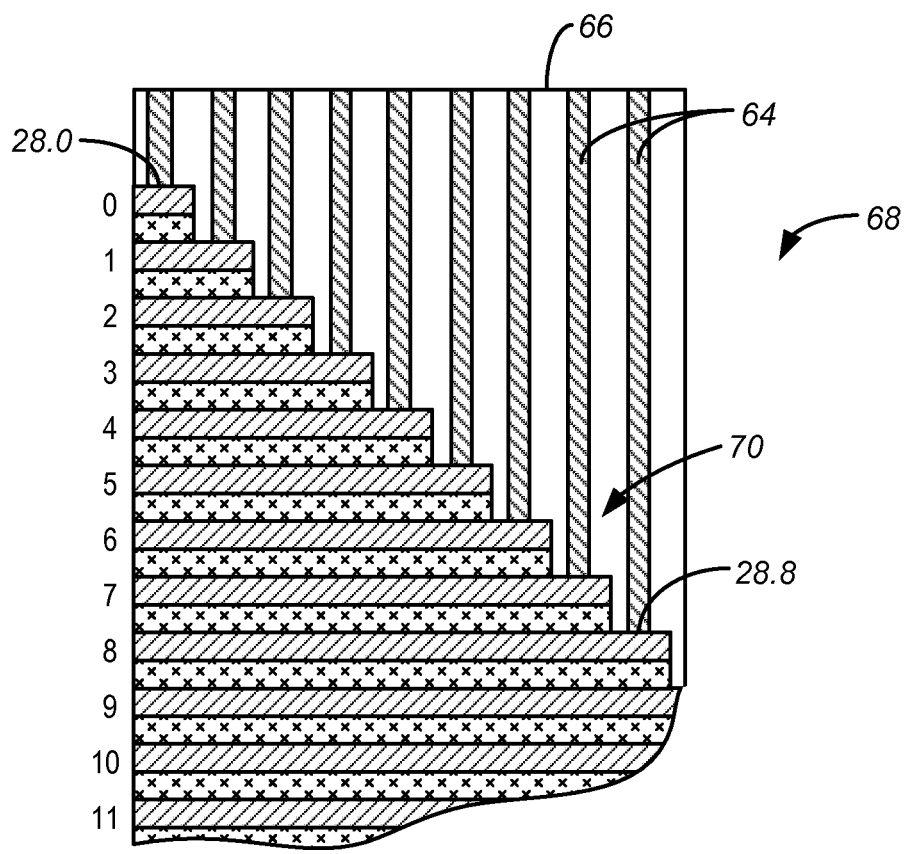
FIG. 24 illustrates the structure of FIG. 23 after the contact openings have been filled with an electrically conductive material forming interlayer connectors contacting the landing areas.

Stairstep structures 412A, 413A, 414A, 415A, which collectively correspond to stair stepped landing area 70 of FIG. 24, terminate semiconductor strips, such as semiconductor strips 412, 413, 414, 415. The method discussed above provide an alternative way of connecting metal layers ML1 and ML2 to semiconductor strips 412, 413, 414, 415 with landing areas 28 of conductive layers 12 corresponding to stairstep structures 412A, 413A, 414A, 415A. As illustrated, these stairstep structures 412A, 413A, 414A, 415A are electrically connected to different bit lines for connection to decoding circuitry to select planes within the array. These stairstep structures 412A, 413A, 414A, 415A can be patterned at the same time that the plurality of ridge-shaped stacks are defined.

Stairstep structures 402B, 403B, 404B, 405B, which also collectively correspond to stair stepped landing area 70 of FIG. 24, terminate semiconductor strips, such as semiconductor strips 402, 403, 404, 405. As illustrated, these stairstep structures 402B, 403B, 404B, 405B are electrically connected to different bit lines for connection to decoding circuitry to select planes within the array. These stairstep structures 402B, 403B, 404B, 405B can be patterned at the same time that the plurality of ridge-shaped stacks are defined.

Any given stack of semiconductor strips is coupled to either the stairstep structures 412A, 413A, 414A, 415A, or the stairstep structures 402B, 403B, 404B, 405B, but not both. A stack of semiconductor strips has one of the two opposite orientations of bit line end-to-source line end orientation, or source line end-to-bit line end orientation. For example, the stack of semiconductor strips 412, 413, 414, 415 has bit line end-to-source line end orientation; and the stack of semiconductor strips 402, 403, 404, 405 has source line end-to-bit line end orientation.

The stack of semiconductor strips 412, 413, 414, 415 is terminated at one end by the stairstep structures 412A, 413A, 414A, 415A, passes through SSL gate structure 419, GSL 426, word lines 425-1 WL through 425-N WL, GSL 427, and terminated at the other end by source line 428. The stack of semiconductor strips 412, 413, 414, 415 does not reach the stairstep structures 402B, 403B, 404B, 405B.

The stack of semiconductor strips 402, 403, 404, 405 is terminated at one end by the stairstep structures 402B, 403B, 404B, 405B, passes through SSL gate structure 409, GSL 427, word lines 425-N WL through 425-1 WL, GSL 426, and terminated at the other end by a source line (obscured by other parts of the figure). The stack of semiconductor strips 402, 403, 404, 405 does not reach the stairstep structures 412A, 413A, 414A, 415A.

A layer of memory material separates the word lines 425-1 through 425-n, from the semiconductor strips 412-415 and 402-405. Ground select lines GSL 426 and GSL 427 are conformal with the plurality of ridge-shaped stacks, similar to the word lines.

Every stack of semiconductor strips is terminated at one end by stairstep structure, and at the other end by a source line. For example, the stack of semiconductor strips 412, 413, 414, 415 is terminated at one end by stairstep structures 412A, 413A, 414A, 415A, and terminated on the other end by source line 428. At the near end of the Fig., every other stack of semiconductor strips is terminated by the stairstep structures 402B, 403B, 404B, 405B; and every other stack of semiconductor strips is terminated by a separate source line. At the far end of the figure, every other stack of semiconductor strips is terminated by the stairstep structures 412A, 413A, 414A, 415A; and every other stack of semiconductor strips is terminated by a separate source line.

Bit lines and string select lines are formed at the metals layers ML1, ML2, and ML3. Transistors are formed between the stairstep structures 412A, 413A, 414A and the word line 425-1. In the transistors, the semiconductor strip (e.g. 413) acts as the channel region of the device. SSL gate structures (e.g. 419, 409) are patterned during the same step that the word lines 425-1 through 425-n are defined. A layer of silicide 426 can be formed along the top surface of the word lines, the ground select lines, and over the gate structures 429. The layer of memory material can act as the gate dielectric for the transistors. These transistors act as string select gates coupled to decoding circuitry for selecting particular ridge-shaped stacks in the array.

A first metal layer ML1 includes string select lines with a lengthwise orientation parallel to the semiconductor material strips. These ML1 string select lines are connected by short vias to different SSL gate structures (e.g., 409, 419). A second metal layer ML2 includes string select lines with a widthwise orientation parallel to the word lines. These ML2 string select lines are connected by short vias to different ML1 string select lines. In combination, these ML1 string select lines and ML2 string select lines allow a string select line signal to select a particular stack of semiconductor strips.

The first metal layer ML1 also includes two source lines with a widthwise orientation parallel to the word lines. Such source lines can serve as reference nodes so that there is a plurality of reference nodes in the array.

Different bit lines are electrically connected to different steps of the stairstep structures 412A, 413A, 414A, 415A and 402B, 403B, 404B, 405B. Such bit lines can serve as a plurality of sensing nodes in the 3D array of NAND strings. These bit lines allow a bit line signal to select a particular horizontal plane of semiconductor strips.

Because a particular word line allows a word line to select a particular row plane of memory cells, the threefold combination of word line signals, bit line signals, and string select line signals is sufficient to select a particular memory cell from the 3D array of memory cells.

Figure 26:
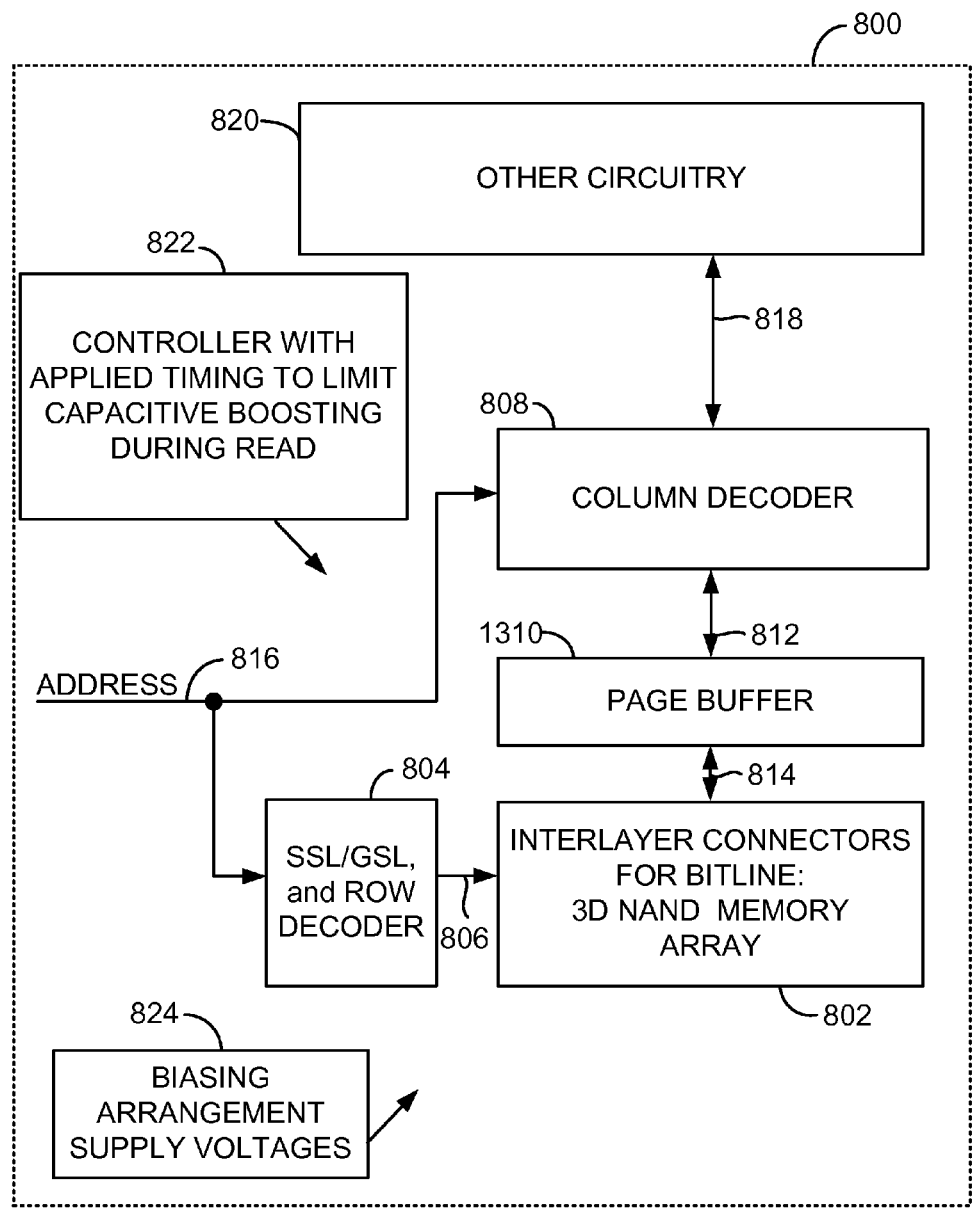
FIG. 26 is a block diagram of an exemplary integrated circuit memory which can be used to carry out aspects of the invention discussed above.

FIG. 26 is a block diagram of an exemplary integrated circuit memory 800 employing memory cells and bias circuitry with a NAND memory array 802 having stepped connectors, such as stepped interlayer connectors 64 shown in FIGS. 24 and 25, to the bit lines or word lines, or both. In some embodiments, the NAND memory array 802 can include multiple levels of cells arranged in multiple NAND strings. A decoder 804 is coupled to a plurality of word lines 806 arranged along rows in the NAND memory array 802 and to the SSL and GSL lines for selecting cells and NAND strings in the array. Decoder 808 is coupled to a set of page buffers 810, in this example via data bus 812. The global bit lines 814 are coupled to local bit lines (not shown in FIG. 26 but corresponding generally to interlayer connectors 64 of FIGS. 24 and 25) for the multiple levels in the NAND memory array 802. Addresses are supplied on bus 816 to decoder block 808 and decoder 804. Data is supplied via the data-in line 818 from other circuitry 820 (including for example input/output ports) on the integrated circuit, such as a general purpose processor or special purpose application circuitry, or a combination of modules providing system-on-a-chip functionality supported by the NAND memory array 802. Data is supplied via the line 818 to input/output ports or to other data destinations internal or external to the integrated circuit 800.

A controller 822, implemented for example as a state machine, provides signals to control the various components of memory 800. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

It should be noted that due to photolithography process variation, it can be difficult to produce fixed length stairstep landing areas 28. In addition, interlayer connectors 64 can strike the landing areas 28 on the corresponding layers in positions that are not precisely positioned in the center of the landing areas. This uneven alignment arises because the mask trimming steps may not be precisely controllable, so that each trimming step results in one unit of variation. Multiple trim steps, used for quaternary and higher approaches, will increase the variation over the variation of a single trim step used in a ternary approach. To compensate for dimensional inaccuracies that can be created by multiple trim steps, additional surface area can be allocated to the interlayer connectors, by increasing the size of the landing areas, but at the expense of reducing packing efficiency.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. The disclosures of any and all patents, patent applications and printed publications referred to above are incorporated by reference.

What is claimed is:

1. A method, for use with an electronic device including a stack comprising a plurality of conductive layers interleaved with a plurality of dielectric layers, for forming interlayer connectors extending to respective ones of the plurality of conductive layers, the method comprising:

removing portions of the conductive layers and the dielectric layers in the stack to form landing areas on the plurality of conductive layers in the stack, the landing areas without overlying conductive layers in the stack, wherein W is the number of conductive layers, the removing step comprising:

etching the stack of dielectric/conductive layers to expose landing areas at W−1 conductive layers using a set of M etch masks, the etch masks having mask regions and spaced apart open etch regions, with M being greater than or equal to 2, and with $N^M$ being less than or equal to W, where N is an integer greater than or equal to 3;

for each etch mask m in the set, where m goes from 0 to M−1:

(a) form etch mask m over the contact region, the etch mask having open etch regions over some of the landing areas;

(b) etch through $N^m$ conductive layers at the open etch regions of mask m; (c) trim etch mask m to increase the size of the open etch regions to overlie additional contact openings;

(d) etch $N^m$ conductive layers at the increased size open etch regions; and (g) if N is greater than 3, repeat the (c) trim step and the (d) etch step N−3 times, whereby the landing areas on the plurality of conductive layers are exposed with different combinations of the etch masks.

2. The method according to claim 1, further comprising:
applying a dielectric fill over the landing areas;
creating contact openings down to the landing areas through the dielectric fill; and
filling the openings with a conductive material thereby forming interlayer connectors.

3. The method according to claim 1, further comprising selecting N as equal to 2 plus the number of trim steps for each etch mask.

4. The method according to claim 1, wherein etch mask 0 has a 0 mask width with an open etch region having an open region width equal to about the 0 mask width divided by N.

5. The method according to claim 1, wherein each etch mask has a mask width with an open etch region having an open region width equal to about the mask width divided by N.

6. The method according to claim 1, wherein in the (a) etch mask forming step, the etch mask covers $N^{m+1}$ landing areas and the open etch region covers $N^m$ of the landing areas.

7. The method according to claim 1, wherein in the (a) etch mask forming step, the open etch regions are over about Nm of the landing areas.

8. The method according to claim 1, wherein W=27 and N=3 so that:
for m=1:
the (b) etch step is carried out to etch 1 conductive layer; and
the (d) etch step is carried out to etch 1 conductive layer;
for m=2:
the (b) etch step is carried out to etch 3 conductive layers; and
the (d) etch step is carried out to etch 3 conductive layers; and
for m=3:
the (b) etch step is carried out to etch 9 conductive layers; and
the (d) etch step is carried out to etch 9 conductive layers.

9. The method according to claim 1, wherein the trimming step is carried out so that the increased size open etch regions overlie about an additional 1/N of the landing areas.

10. The method according to claim 1, wherein the device includes a surface over the stack, and further comprising shielding a portion of the surface during the removing step to create dummy areas without contact openings.

11. A method, for use with an integrated circuit device including a stack comprising a plurality of conductive layers interleaved with a plurality of dielectric layers, for forming interlayer connectors extending to respective ones of the plurality of conductive layers, the method comprising:
removing portions of the conductive layers and the dielectric layers in the stack to form landing areas on the plurality of conductive layers in the stack, the landing areas without overlying conductive layers in the stack, wherein said removing includes using a set of M etch masks with M being greater than or equal to 2, and with $N^M$ being less than or equal to W, the etch masks having mask regions and spaced apart open etch regions corresponding to selected landing areas, wherein W is the number of total conductive layers; for each etch mask m, where m goes from 0 to M−1, etching $N^m$ conductive layers over up to 1/N of the landing areas, trimming the etch mask m, and etching $N^m$ conductive layers over up to 1/N of the landing areas, so that the landing areas on the plurality of conductive layers are exposed with different combinations of the etch masks.

12. The method according to claim 11, wherein when N=3, each etch mask is trimmed once between etching the conductive layers.

13. The method according to claim 11, wherein when N=4, each etch mask is trimmed twice between etching conductive layers.

14. The method according to claim 11, wherein the spaced apart open etch regions overlie about 1/N of the contact openings.

15. The method according to claim 14, wherein trimming is carried out to create an increased size open etch region overlying about an additional 1/N of the contact openings.

16. The method according to claim 11, further comprising forming interlayer connectors extending to the landing areas of the conductive layers.

17. The method according to claim 16, wherein the interlayer connectors forming step comprises:
filling over the landing areas with a dielectric fill material; and
using a patterned etching process and a conductive material deposition process to form the interlayer connectors extending through the dielectric fill material to the landing areas in the plurality of conductive layers.

18. The method according to claim 11, wherein the device includes a surface over the stack, and further comprising shielding a portion of the surface during the portions removing step.

19. The method according to claim 18, wherein the shielding step is carried out using a hard mask layer at the surface.

20. A set of etch masks for use in exposing landing areas on a plurality of conductive layers interleaved with a plurality of dielectric layers comprising:
a set of M etch masks, the etch masks having mask regions and spaced apart open etch regions, where M is an integer greater than or equal to 2 and N is an integer greater than or equal to 3;
for each etch mask m in the set, where m goes from 0 to M−1, the etch mask covers landing areas on $N^{m+1}$ of the conductive layers and the open etch region covers landing areas on $N^m$ of the conductive layers.

* * * * *

UNITED STATES PATENT AND TRADEMARK OFFICE
CERTIFICATE OF CORRECTION

PATENT NO. : 8,759,217 B1
APPLICATION NO. : 13/735922
DATED : June 24, 2014
INVENTOR(S) : Shih-Hung Chen It is certified that error appears in the above-identified patent and that said Letters Patent is hereby corrected as shown below:

In the Claims

In claim 7, column 13, line 29, delete the word "Nm", and insert instead -- $N^m$ --.

Signed and Sealed this
Sixteenth Day of September, 2014

Michelle K. Lee
*Deputy Director of the United States Patent and Trademark Office*